United States Patent
Li et al.

(10) Patent No.: US 10,903,855 B2
(45) Date of Patent: Jan. 26, 2021

(54) CONVOLUTIONAL LDPC DECODING METHOD AND APPARATUS, DECODER, AND SYSTEM

(71) Applicant: HUAWEI TECHNOLOGIES CO., LTD., Guangdong (CN)

(72) Inventors: Mo Li, Chengdu (CN); Zhiyu Xiao, Chengdu (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 37 days.

(21) Appl. No.: 16/191,664

(22) Filed: Nov. 15, 2018

(65) Prior Publication Data
US 2019/0089375 A1 Mar. 21, 2019

Related U.S. Application Data

(63) Continuation of application No. PCT/CN2016/082211, filed on May 16, 2016.

(51) Int. Cl.
*H03M 13/00* (2006.01)
*H03M 13/11* (2006.01)
(Continued)

(52) U.S. Cl.
CPC .... *H03M 13/1125* (2013.01); *H03M 13/1154* (2013.01); *H03M 13/23* (2013.01);
(Continued)

(58) Field of Classification Search
CPC ............. G06F 11/1412; G06F 11/1044; G06F 11/1068; G06F 11/00; G06F 11/1048;
(Continued)

(56) References Cited

U.S. PATENT DOCUMENTS

| 9,036,992 B2 | 5/2015 | Djordjevic et al. |
| 2007/0168833 A1* | 7/2007 | Lestable ............ H03M 13/1117 714/758 |

(Continued)

FOREIGN PATENT DOCUMENTS

| CN | 101478312 A | 7/2009 |
| CN | 101689866 A | 3/2010 |

(Continued)

OTHER PUBLICATIONS

Aravind Iyengar et al: "Windowed Decoding of Protograph-based LDPC Convolutional Codes over Erasure Channels", arxiv.org, Cornell University Library, 201 Olin Library Cornell University Ithaca, NY 14853, Oct. 21, 2010,XP080458136.

(Continued)

*Primary Examiner* — Guerrier Merant
(74) *Attorney, Agent, or Firm* — Womble Bond Dickinson (US) LLP

(57) ABSTRACT

The present disclosure provides a method, system, and terminal device for data transmission in an unlicensed spectrum, effectively reduce mutual signal interference between different systems while meeting regulation constraints on use of the unlicensed spectrum. The method in the present disclosure includes: at a processing start moment of a terminal device in a current channel occupancy time window of a network device, when remaining duration of the current channel occupancy time window of the network device is greater than or equal to duration for the terminal device to transmit a to-be-sent data packet to the network device, selecting based on a user attribute of the terminal device and from a mapping relationship between a user attribute and a transmission mode; and sending the to-be-sent data packet to the network device in the selected transmission mode.

10 Claims, 9 Drawing Sheets

(51) Int. Cl.
*H03M 13/25* (2006.01)
*H04L 1/00* (2006.01)
*H03M 13/29* (2006.01)
*H03M 13/23* (2006.01)

(52) U.S. Cl.
CPC ..... *H03M 13/255* (2013.01); *H03M 13/2957* (2013.01); *H03M 13/6325* (2013.01); *H04L 1/005* (2013.01); *H04L 1/0057* (2013.01); *H04L 1/0059* (2013.01)

(58) Field of Classification Search
CPC .... H03M 13/1125; H03M 7/42; H03M 13/00; H03M 13/45; H03M 13/1154; H03M 13/23; H03M 13/255; H03M 13/6325; H03M 13/1102; H03M 13/2906; H03M 13/3769; H03M 13/1111; G11C 11/5642; G11C 16/26; G11C 11/56; G11C 8/20; G11C 27/005; G11C 27/11; G11C 27/5642; H04L 1/005; H04L 1/0057; H04L 1/0059
See application file for complete search history.

(56) References Cited

U.S. PATENT DOCUMENTS

| | | |
|---|---|---|
| 2010/0199153 A1 | 8/2010 | Okamura et al. |
| 2011/0138258 A1 | 6/2011 | Okamura et al. |
| 2011/0264979 A1* | 10/2011 | Gunnam ............ H03M 13/1128 714/752 |
| 2012/0324309 A1 | 12/2012 | Murakami et al. |
| 2013/0061117 A1 | 3/2013 | Gioulekas et al. |
| 2013/0132803 A1 | 5/2013 | Xiao et al. |
| 2013/0139025 A1 | 5/2013 | Gioulekas et al. |
| 2013/0208836 A1* | 8/2013 | Yamamoto ............... H04L 1/005 375/341 |

FOREIGN PATENT DOCUMENTS

| | | |
|---|---|---|
| CN | 101785188 A | 7/2010 |
| CN | 101785189 A | 7/2010 |
| CN | 102611462 A | 7/2012 |
| CN | 102725964 A | 10/2012 |
| JP | 2009246927 A | 10/2009 |
| WO | 2010/136930 A1 | 12/2010 |

OTHER PUBLICATIONS

Brink Ten S et al: "Iterative Demapping and Decoding for Multilevel Modulation", Proc., IEEE Global Telecommunications Conference, GLOBECOM "98, Sydney, Nov. 8-12, 1998, Nov. 8, 1998, pp. 579-584, XP000894365.

Deyuan Chang et al: "Implementation of coded modulation and FEC", Proc., Optical Fiber Communication Conference and Exposition and the National Fiber Optic Engineers Conference (OFC/NFOEC), 2013, IEEE, Mar. 17, 2013, pp. 1-3, XP032678934.

Deyuan Chang et al: "LDPC convolutional codes using layered decoding algorithm for high speed coherent optical transmission", Proc., Optical Fiber Communication Conference and Exposition and the National Fiber Optic Engineers Conference, (OFC/NFOEC), 2012 IEEE, Mar. 4, 2012, pp. 1-3, XP032340023.

Pusane A E et al:"Implementation aspects of LDPC convolutional codes",IEEE Transactions on Communications,IEEE Service Center,Piscataway,NJ.USA,vol. 56, No. 7, Jul. 1, 2008,pp. 1060-1069,XP011231533.

Schmalen Laurent et al: "Forward error correction in optical core and optical access networks",Bell Labs Technical Journal, Wiley, CA, US, vol. 18, No. 3, Dec. 1, 2013,pp. 39-66, XP011628132.

Xiang Liu et al: "Generation and FEC-decoding of a 231.5-Gb/s PDM-OFDM signal with 256-iterative-polar-modulation achieving 11.15-b/s/Hz intrachannel spectral efficiency and 800-km reach", Proc., Optical Fiber Communication Conference and Exposition and the National Fiber Optic Engineers Conference, (OFC/NFOEC), 2012 IEEE, Mar. 4, 2012, paces 1-3, XP032340147.

Frank Schreckenbach et al.Optimization of Symbol Mappings for Bit-Interleaved Coded Modulation With Iterative Decoding IEEE Communications Letters, vol. 7, No. 12, Dec. 2003. pp. 593-595.

* cited by examiner

CONVOLUTIONAL LDPC DECODING METHOD AND APPARATUS, DECODER, AND SYSTEM

CROSS-REFERENCE TO RELATED APPLICATIONS

This application is a continuation of International Application No. PCT/CN2016/082211, filed on May 16, 2016, the disclosure of which is hereby incorporated by reference in its entirety.

TECHNICAL FIELD

The present disclosure relates to the field of communications technologies, and in particular, to a convolutional LDPC decoding method and apparatus, a decoder, and a system.

BACKGROUND

With development of a high-speed information transmission system, especially popularization of a Forward Error Correction (FEC) technology, to implement a high-performance, high-traffic, and easy-to-implement FEC process in a communications network system, Low Density Parity Check (LDPC) code with relatively high transmission performance may be used to carry out information transmission.

Conventional LDPC decoding is performed based on a single piece of block information, and may be specifically implemented by using a parity-check matrix (H matrix). The H matrix is an M×N matrix. N is a block code length, K is an information length, and M=N−K. The H matrix indicates that there are M parity-check equations, and each row of the H matrix indicates one parity-check equation. An LDPC block decoder usually divides the M parity-check equations into m layers, and each layer includes M/m parity-check equations. In a decoding process, the LDPC block decoder performs parity check on one code word by using layer 1 to layer m parity-check equations separately. An output decoding result is fed back to an input end of the LDPC block decoder, and iteration is performed for a plurality of times until the decoding process is completed.

In addition to the foregoing conventional LDPC block decoding manner, LDPC decoding manners include a convolutional LDPC decoding manner. Currently, a pipelined serial decoder architecture for convolutional LDPC is proposed. As shown in FIG. 1, after being processed by a demapping unit, a symbol successively passes through decoding units 1 to n, and finally passes through a determining output unit to obtain a final decoding result, where n is a positive integer greater than 1. A decoding control unit may be configured to control enabling of other units. Compared with the conventional LDPC decoding process, this method can reduce a code length in each time of information processing, reduce circuit implementation difficulty, and improve coding and decoding performance. However, incorrect decoding still occurs.

SUMMARY

Embodiments of the present disclosure provide a convolutional LDPC decoding method and apparatus, a decoder, and a system, so as to improve accuracy of a decoding process.

To achieve the foregoing objective, the following technical solutions are used in the embodiments of the present invention:

According to a first aspect, an embodiment of the present disclosure provides a convolutional LDPC decoding method, where the method includes: receiving first check node information including all check node information that is corresponding to a target bit and output by a previous-level decoding unit; reading, from a symbol caching unit, a symbol value corresponding to the target bit; determining a log-likelihood ratio (LLR) and a first a priori probability (APP) based on the first check node information and the symbol value, where the first APP is used to indicate a decoding result of the target bit at a first moment; and sending the first check node information and the first APP to a next-level decoding unit, so that the next-level decoding unit obtains a second APP and second check node information based on the first check node information and the first APP, where the second APP is used to indicate a decoding result of the target bit at a second moment, and the second check node information includes all check node information that is corresponding to the target bit and output by the next-level decoding unit.

The LLR in a convolutional LDPC decoding process is adjusted based on all the check node information that is corresponding to the target bit and output by the previous-level decoding unit and the symbol value corresponding to the target bit. In other words, on the basis of adjusting the first check node information, the LLR is adjusted to further improve accuracy of the convolutional LDPC decoding process. In this way, accuracy of a decoding process implemented in a coherent optical transmission system can be improved. To be specific, a receiver may perform decoding based on a symbol value received from a transmitter, and obtain an accurate decoding result, thereby improving transmission performance of the coherent optical transmission system.

With reference to the first aspect, in a first possible implementation of the first aspect, the determining an LLR and a first APP based on the first check node information and the symbol value includes: determining extrinsic information of each bit corresponding to the symbol value, where the symbol value corresponds to at least two bits and the extrinsic information is a sum of all check node information output by the previous-level decoding unit; determining the LLR based on the extrinsic information of each bit; and determining that a sum of extrinsic information of the target bit and the LLR is the first APP.

In the process of determining the LLR, the extrinsic information of each bit corresponding to the symbol value may be first determined. To be specific, extrinsic information of an individual bit is determined by performing summation on all check node information of the individual bit. Then, the LLR is determined based on the obtained extrinsic information of each bit. This ensures that the determined LLR can achieve a convergence effect, so that the accuracy of the decoding process is further improved. In other words, the transmission performance of the coherent optical transmission system is further improved.

With reference to the first possible implementation of the first aspect, in a second possible implementation of the first aspect, the symbol value includes an I value and a Q value, the symbol value is used to indicate a symbol point, and the determining the LLR based on the extrinsic information of each bit includes: determining coordinates of the symbol point based on the I value and the Q value; and performing calculation by using a formula $$LLR(C_i) = \log \frac{\sum_{\vec{a} \in \chi_i^{(0)}} \exp\left[\frac{-d_{\vec{a}}^{\rho}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}^{\rho}}{2\sigma^2} + \sum_{j=1, j \neq i}^{m} G(f(\vec{a}, j))L(C_j)\right]}$$

to obtain an LLR corresponding to an $i^{th}$ bit, namely the LLR, where a indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_a^\rho$ indicates a Euclidean distance from the symbol point to the target constellation point, $f(\vec{a},j)$ indicates a value of a $j^{th}$ bit in the target constellation point, $G(x)$ indicates a function of x, $$G(x) = \begin{cases} 1 & \text{if } (x == 0) \\ 0 & \text{if } (x == 1) \end{cases},$$

$L(C_j)$ indicates extrinsic information of the $j^{th}$ bit, σ indicates a standard deviation, m is a positive integer greater than 1, and i and j are positive integers greater than or equal to 1.

In the process of determining the LLR, not only a position of the symbol point is considered, but also the extrinsic information of each bit corresponding to the symbol value is considered. In addition, calculation is performed with reference to the formula, so that a more applicable LLR is obtained. This means that the LLR and ΣCN are alternately adjusted to ensure the accuracy of the decoding process, and the transmission performance of the coherent optical transmission system is further improved.

According to a second aspect, an embodiment of the present disclosure provides a convolutional LDPC decoding method, where the method is used in a coherent optical transmission system and the method includes: obtaining, by a decoder, a symbol value output by a receiver in the coherent optical transmission system; performing, by the decoder based on an iterative algorithm, calculation on each bit corresponding to the symbol value, to obtain a decoding result of each bit, where the iterative algorithm includes at least one update of check node information and at least one update of a log-likelihood ratio (LLR); and determining, by the decoder, a decoding result of each bit based on check node information and an LLR that are each obtained in a last update in the iterative algorithm.

An operation is performed, based on an iterative algorithm, on each bit corresponding to the symbol value, so as to adjust the LLR in a convolutional LDPC decoding process. In other words, on the basis of adjusting the first check node information, the LLR is adjusted to further improve accuracy of the convolutional LDPC decoding process. In this way, accuracy of a decoding process implemented in the coherent optical transmission system can be improved. To be specific, a receiver may perform decoding based on a symbol value received from a transmitter, and obtain an accurate decoding result, thereby improving transmission performance of the coherent optical transmission system.

With reference to the second aspect, in a first possible implementation of the second aspect, after the determining, by the decoder, a decoding result of each bit, the method includes: determining, by the decoder based on the decoding result of each bit, a decoding result corresponding to the symbol value.

When the accuracy of the decoding process implemented in the coherent optical transmission system is improved, in the decoding process, each bit corresponding to the symbol value is decoded first to obtain the decoding result corresponding to each bit, and then the decoding results are integrated to obtain the decoding result corresponding to the whole symbol value. In this way, not only the accuracy of the decoding process can be further improved, but also an error rate of the decoding process can be reduced to some extent, because data is decoded in unit of bit.

With reference to the first possible implementation of the second aspect, in a second possible implementation of the second aspect, the decoding result corresponding to the symbol value is a binary bit stream, and after the determining, by the decoder, a decoding result corresponding to the symbol value, the method includes: sending, by the decoder, the binary bit stream to a network device in a switching node, so that the network device sends the binary bit stream to a target device, to complete a communication data transmission process.

When the accuracy of the decoding process implemented in the coherent optical transmission system is improved, the decoding result is sent to the network device, and then sent to the target device by the network device, to complete a communication data forwarding process.

According to a third aspect, an embodiment of the present disclosure provides a convolutional LDPC decoding apparatus, where the apparatus includes: a receiving module, configured to receive first check node information including all check node information that is corresponding to a target bit and output by a previous-level decoding unit; a reading module, configured to read, from a symbol caching unit, a symbol value corresponding to the target bit; a determining module, configured to determine a log-likelihood ratio (LLR) and a first a priori probability (APP) based on the first check node information and the symbol value, where the first APP is used to indicate a decoding result of the target bit at a first moment; and a sending module, configured to send the first check node information and the first APP to a next-level decoding unit, so that the next-level decoding unit obtains a second APP and second check node information based on the first check node information and the first APP, where the second APP is used to indicate a decoding result of the target bit at a second moment, and the second check node information includes all check node information that is corresponding to the target bit and output by the next-level decoding unit.

With reference to the third aspect, in a first possible implementation of the third aspect, the determining module is specifically configured to: determine extrinsic information of each bit corresponding to the symbol value, where the symbol value corresponds to at least two bits and the extrinsic information is a sum of all check node information output by the previous-level decoding unit; determine the LLR based on the extrinsic information of each bit; and determine that a sum of extrinsic information of the target bit and the LLR is the first APP.

With reference to the first possible implementation of the third aspect, in a second possible implementation of the third aspect, the symbol value includes an I value and a Q value, the symbol value is used to indicate a symbol point, and the determining module is specifically configured to: determine coordinates of the symbol point based on the I value and the Q value; and perform calculation by using a formula $$LLR(C_i) = \log \frac{\sum_{\overset{\rho}{a} \in \chi_i^{(0)}} \exp\left[\frac{-d_{\overset{\rho}{a}}}{2\sigma^2} + \sum_{j=1, j \neq i}^{m} G(f(\overset{\rho}{a}, j))L(C_j)\right]}{\sum_{\overset{\rho}{a} \in \chi_i^{(1)}} \exp\left[\frac{-d_{\overset{\rho}{a}}}{2\sigma^2} + \sum_{j=1, j \neq i}^{m} G(f(\overset{\rho}{a}, j))L(C_j)\right]}$$

to obtain an LLR corresponding to an $i^{th}$ bit, namely the LLR, where $\overset{\rho}{a}$ indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_{\overset{\rho}{a}}$ indicates a Euclidean distance from the symbol point to the target constellation point, $f(\overset{\rho}{a},j)$ indicates a value of a $j^{th}$ bit in the target constellation point, $G(x)$ indicates a function of x, $$G(x) = \begin{cases} 1 & \text{if } (x == 0) \\ 0 & \text{if } (x == 1) \end{cases},$$

$L(C_j)$ indicates extrinsic information of the $j^{th}$ bit, σ indicates a standard deviation, m is a positive integer greater than 1, and i and j are positive integers greater than or equal to 1.

According to a fourth aspect, an embodiment of the present disclosure provides a convolutional LDPC decoding apparatus, where the apparatus is used in a coherent optical transmission system and the apparatus includes: an obtaining module, configured to obtain a symbol value output by a receiver in the coherent optical transmission system; a calculation module, configured to perform, based on an iterative algorithm, calculation on each bit corresponding to the symbol value, to obtain a decoding result of each bit, where the iterative algorithm includes at least one update of check node information and at least one update of a log-likelihood ratio (LLR); and a determining module, configured to determine a decoding result of each bit based on check node information and an LLR that are each obtained in a last update in the iterative algorithm.

With reference to the fourth aspect, in a first possible implementation of the fourth aspect, the determining module is further configured to determine, based on the decoding result of each bit, a decoding result corresponding to the symbol value.

With reference to the first possible implementation of the fourth aspect, in a second possible implementation of the fourth aspect, the decoding result corresponding to the symbol value is a binary bit stream, and the apparatus further includes: a sending module, configured to send the binary bit stream to a network device in a switching node, so that the network device sends the binary bit stream to a target device, to complete a communication data transmission process.

According to a fifth aspect, an embodiment of the present disclosure provides a decoder, where the decoder is used in a coherent optical transmission system and the decoder includes: an interface circuit, configured to obtain a symbol value output by a receiver in the coherent optical transmission system; and a processor, configured to perform, based on an iterative algorithm, calculation on each bit corresponding to the symbol value, to obtain a decoding result of each bit, where the iterative algorithm includes at least one update of check node information and at least one update of a log-likelihood ratio (LLR); and the processor is further configured to determine a decoding result of each bit based on check node information and an LLR that are each obtained in a last update in the iterative algorithm.

With reference to the fifth aspect, in a first possible implementation of the fifth aspect, after determining the decoding result of each bit, the processor is further configured to: determine, based on the decoding result of each bit, a decoding result corresponding to the symbol value, and send the decoding result.

According to a sixth aspect, an embodiment of the present disclosure provides a coherent optical transmission system including a transmitter, a receiver, and a decoder, and the decoder is the decoder according to the fifth aspect.

According to the convolutional LDPC decoding method and apparatus, the decoder, and the system provided in the embodiments of the present invention, the LLR and the first APP are determined based on all the check node information that is corresponding to the target bit and output by the previous-level decoding unit and the symbol value that is corresponding to the target bit and read from the symbol caching unit, and then all the check node information that is corresponding to the target bit and output by the previous-level decoding unit and the first APP are sent to the next-level decoding unit, so that the next-level decoding unit obtains the second APP and the second check node information. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. However, in a convolutional LDPC decoding process in the present invention, the LLR may be adjusted based on all the check node information that is corresponding to the target bit and output by the previous-level decoding unit and the symbol value corresponding to the target bit. In other words, on the basis of adjusting the first check node information, the LLR is adjusted to further improve accuracy of the convolutional LDPC decoding process. In this way, accuracy of a decoding process implemented in the coherent optical transmission system can be improved. To be specific, a receiver may perform decoding based on a symbol value received from a transmitter, and obtain an accurate decoding result, thereby improving transmission performance of the coherent optical transmission system.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present invention. Apparently, the described embodiments are merely some but not all of the embodiments of the present invention. All other embodiments obtained by a person of ordinary skill in the art based on the embodiments of the present disclosure without creative efforts shall fall within the protection scope of the present invention.

Figure 1:
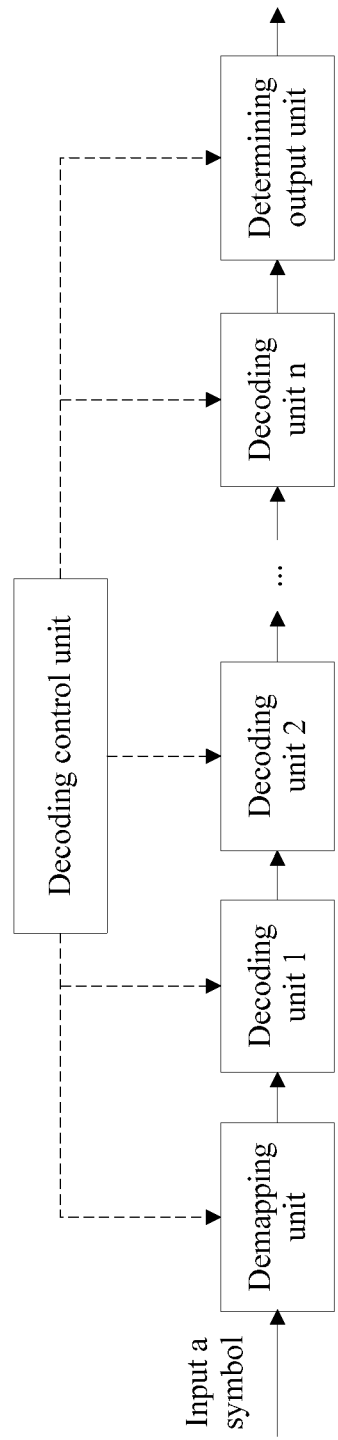
FIG. 1 is a schematic diagram of a specific application scenario according to an embodiment of the present invention.
Figure 2:
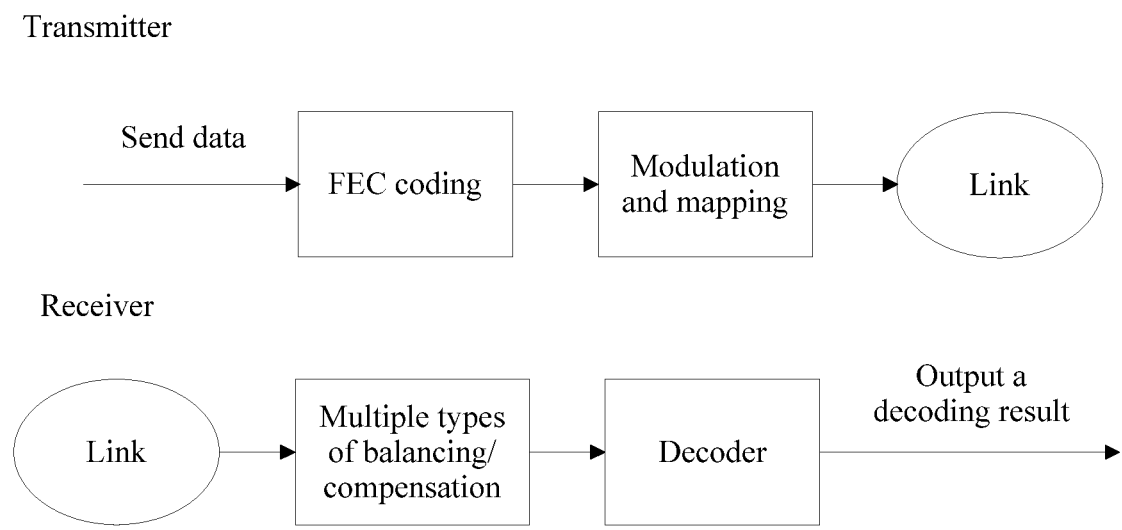
FIG. 2 is a schematic diagram of another specific application scenario according to an embodiment of the present invention.
Figure 3:
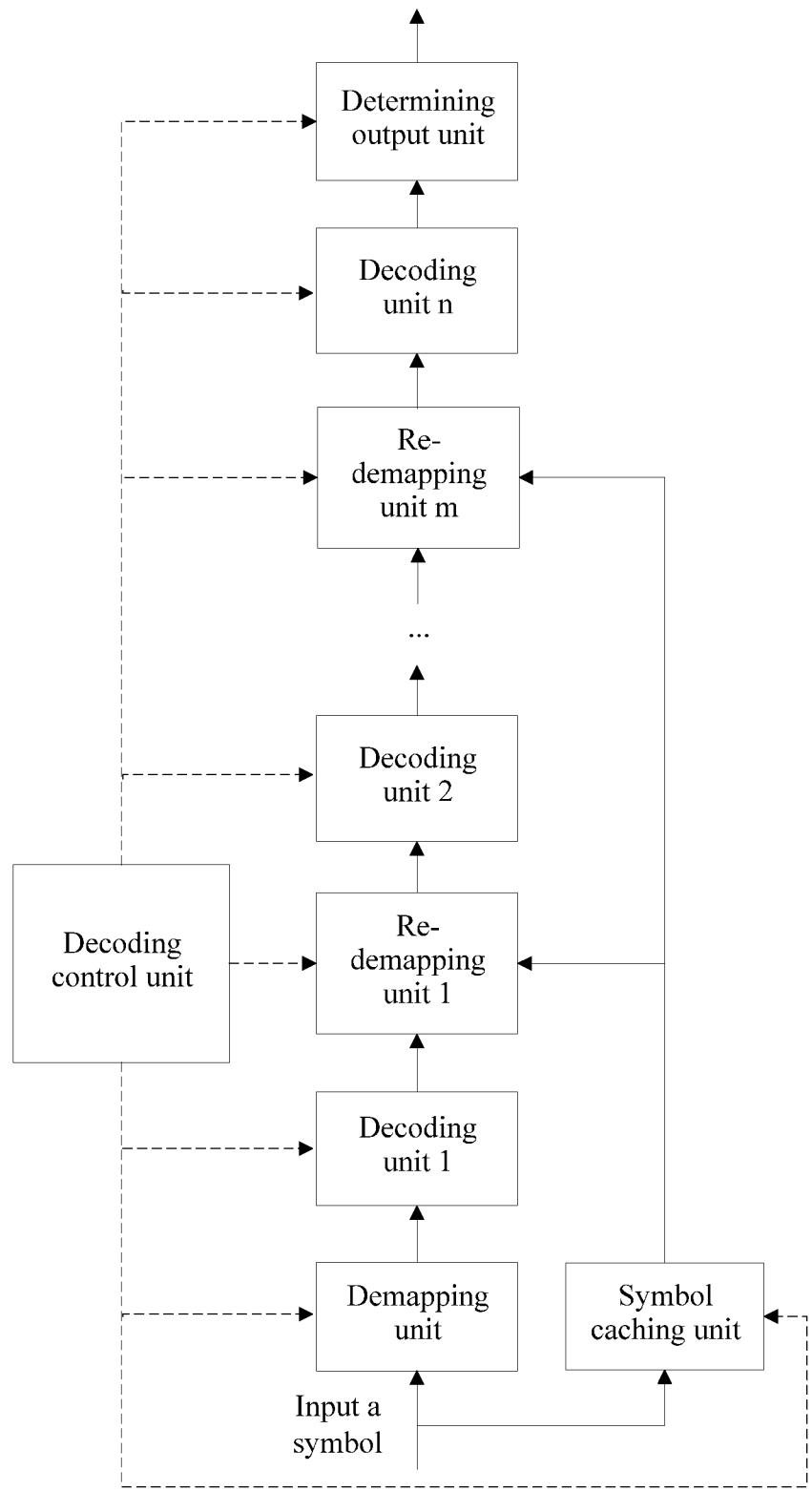
FIG. 3 is a schematic diagram of another specific application scenario according to an embodiment of the present invention.

In the embodiments of the present invention, a symbol caching unit and at least one re-demapping unit may be added to the architecture shown in FIG. 1, and then on the basis that first check node information is adjusted in a decoding process in the prior art, an LLR is adjusted to make a decoding result obtained in a convolutional LDPC decoding process more accurate. It should be noted that the architecture used in the present disclosure may be located in a coherent optical transmission system that includes a transmitter and a receiver. The architecture used in the present disclosure may be considered as a part of the receiver, or an architecture used for implementing a decoding process after the receiver receives data transmitted in a link. In the coherent transmission system shown in FIG. 2, the transmitter sends data, and after the data undergoes FEC coding and modulation and mapping processes, a symbol value including in-phase/quadrature (I/Q) components is obtained. Then, after the data is transmitted in a link to the receiver and undergoes a plurality of types of balancing/compensation, a symbol value including I/Q components is obtained. Then, a decoder performs a subsequent decoding operation according to the method procedure provided in the present invention, to obtain a decoding result. For example, FIG. 3 shows an architecture in which m re-demapping units are added to the existing architecture, where m is a positive integer greater than 1 and less than n. In this embodiment of the present invention, a decoding control unit may also be configured to control enabling of the re-demapping units and the symbol caching unit, and the symbol caching unit may be configured to store symbol values corresponding to bits, so that the re-demapping units can obtain corresponding symbol values from the symbol caching unit when the re-demapping units need the corresponding symbol values. It should be noted that a re-demapping unit may be arranged between two neighboring decoding units in a serial architecture. In addition, because a plurality of row-layered decoding processes need to be performed in each decoding unit, to further improve accuracy of a decoding process, a re-demapping unit may be added between two neighboring row-layered decoding processes in a decoding unit. In this embodiment of the present invention, one or more re-demapping units may be arranged based on a decoding accuracy requirement and/or a status of a resource available for re-demapping, and no specific limitation is imposed on a location and a quantity of the arranged re-demapping units.

Figure 4:
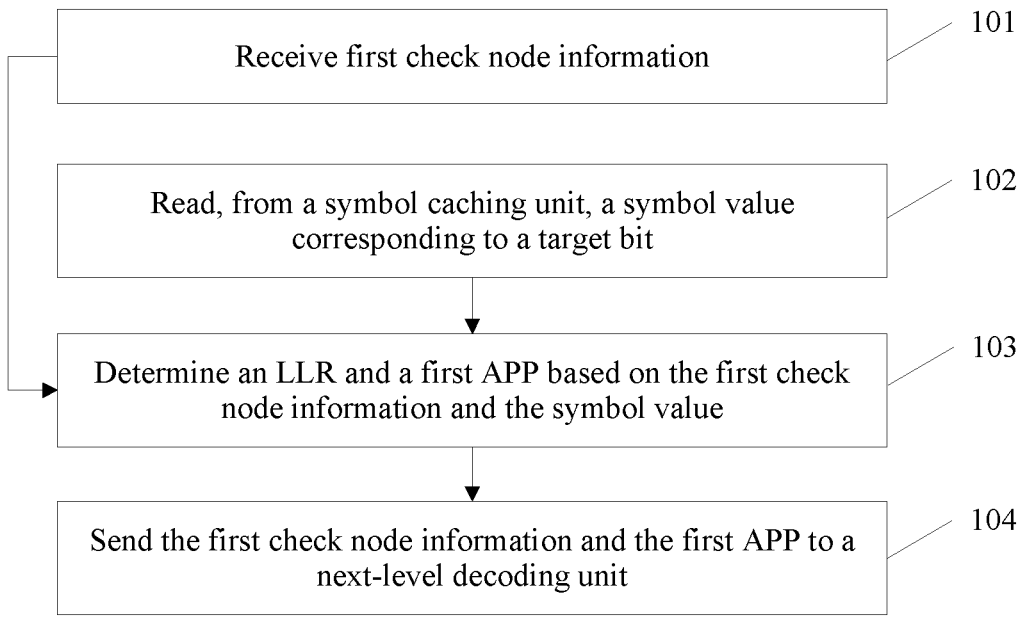
FIG. 4 is a flowchart of a convolutional LDPC decoding method according to an embodiment of the present invention.

An embodiment of the present disclosure provides a convolutional LDPC decoding method. For example, a re-demapping unit is arranged between two neighboring decoding units. As shown in FIG. 4, the method may be executed by a re-demapping unit. A procedure for the method includes:

101. Receive first check node information.

The first check node information includes all check node information that is corresponding to a target bit and output by a previous-level decoding unit.

Because each parity-check equation corresponds to one piece of check node information, if the target bit corresponds to four parity-check equations in the previous-level decoding unit, the previous-level decoding unit outputs four pieces of check node information. A set consisting of the four pieces of check node information may be considered as the first check node information. The first check node information may be specifically represented by Check Node (CN) 1, CN 2, CN 3, and CN 4.

It should be noted that each decoding unit not only can output the first check node information, but also can output an A Priori Probability (APP) obtained by the decoding unit. In the architecture shown in FIG. 3, a decoding unit n outputs an APP that is finally obtained after a symbol passes through an entire serial architecture. The APP is output information of an LDCP decoder. Then, a determining output unit may determine that a determining result of the bit is 0 when the APP is greater than or equal to 0, or a determining result of the bit is 1 when the APP is less than 0, and the determining output unit outputs the determining result.

102. Read, from a symbol caching unit, a symbol value corresponding to a target bit.

When a symbol is input into a demapping unit, or before a symbol is input into a demapping unit, the symbol may be stored in the symbol caching unit. In this way, when the re-demapping unit needs to obtain the symbol value corresponding to the target bit, the re-demapping unit may directly read the symbol value from the symbol caching unit.

103. Determine a Log Likelihood Ratio (LLR) and a first APP based on the first check node information and the symbol value.

The first APP is used to indicate a decoding result of the target bit at a first moment. This means that, if no next-level decoding unit or re-demapping unit follows the re-demapping unit, the first APP may be used to indicate a final decoding result of the target bit; or if a next-level decoding unit or another re-demapping unit follows the re-demapping unit, the first APP can be used to indicate only the decoding result of the target bit at the first moment and may be considered as a temporary decoding result in an entire decoding process. The first moment is a moment when the first APP is obtained after the target bit passes through the re-demapping unit.

A core decoding formula for an LDCP decoding algorithm is APP=LLR+ΣCN. In the prior art, the LLR is input soft information of a bit and may be obtained from a channel or a previous-section balancing module, and a value of the LLR is constant. This means that, in the prior art, the APP is updated by adjusting ΣCN by using decoding units, to finally obtain a more accurate decoding result.

However, in this embodiment of the present invention, the re-demapping unit is mainly added to update the LLR. Because an initial LLR is a demapping result, to obtain a new LLR, a demapping operation also needs to be performed on a symbol. In other words, the re-demapping unit performs a re-demapping operation based on the first check node information and the obtained symbol value to obtain the new LLR, thereby updating the LLR. With reference to the foregoing decoding formula, because the LLR is updated, when outputting the new LLR, the re-demapping unit further outputs a new APP, namely the first APP, that is obtained through calculation based on the new LLR and ΣCN, that is, a sum of all CN output by the previous-level decoding unit.

Figure 5:
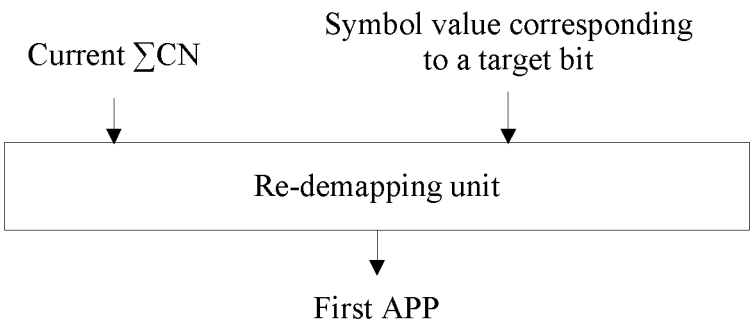
FIG. 5 is a schematic diagram of a decoding process according to an embodiment of the present invention.

As shown in FIG. 5, the current ΣCN and the symbol value corresponding to the target bit are input into the re-demapping unit, and the first APP is output. It should be noted that the previous-level decoding unit can output CN corresponding to each parity-check equation. In this embodiment of the present invention, ΣCN may be directly calculated by the previous-level decoding unit and then sent to the re-demapping unit. However, because the re-demapping unit further needs to send, to the next-level decoding unit, the CN corresponding to each parity-check equation in the previous-level decoding unit, in this embodiment of the present invention, alternatively, ΣCN may be directly calculated by the re-demapping unit, or may be calculated by another unit and then sent to the re-demapping unit. For the next-level decoding unit that follows the re-demapping unit and is connected to the re-demapping unit in series, because the first APP output by the re-demapping unit and all the CN output by the previous-level decoding unit are input parameters of the next-level decoding unit, the next-level decoding unit may deduce, by using the foregoing decoding formula, the LLR updated by the re-demapping unit, and update the CN based on the updated LLR.

104. Send the first check node information and the first APP to a next-level decoding unit.

Because the re-demapping unit updates only the LLR, the first APP obtained through calculation and the first check node information output by the previous-level decoding unit are output during output. Then, the next-level decoding unit may perform calculation based on the first APP and ΣCN, that is, a sum of all the check node information in the first check node information, to obtain the LLR updated by the re-demapping unit, and perform calculation by using the foregoing decoding formula based on the updated LLR and ΣCN that is updated by the next-level decoding unit, to obtain a second APP. It should be noted that ΣCN updated by the next-level decoding unit may be obtained by performing summation on CN values corresponding to all parity-check equations of the next-level decoding unit. Herein, a set consisting of all the CN values may be considered as second check node information. The second APP is used to indicate a decoding result of the target bit at a second moment, and the second check node information includes all check node information that is corresponding to the target bit and output by the next-level decoding unit. This means that, if no decoding unit or re-demapping unit follows the next-level decoding unit, the second APP may be used to indicate a final decoding result of the target bit; or if another decoding unit or re-demapping unit follows the next-level decoding unit, the second APP can be used to indicate only the decoding result of the target bit at the second moment and may be considered as a temporary decoding result in the entire decoding process. The second moment is a moment when the second APP is obtained after the target bit passes through the next-level decoding unit.

Figure 6:
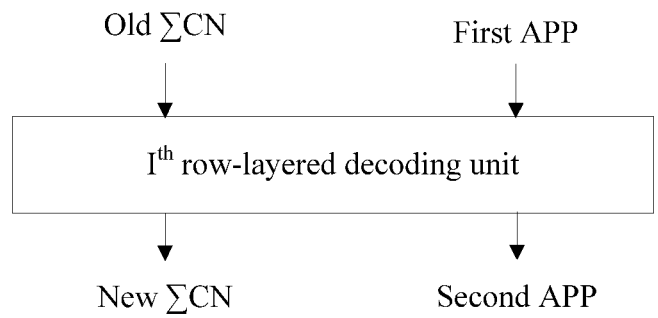
FIG. 6 is a schematic diagram of a re-demapping process according to an embodiment of the present invention.

As shown in FIG. 6, an old ΣCN and a first APP are input of an $i^{th}$ row-layered decoding unit, and a new ΣCN and a second APP are output. It should be noted that the re-demapping unit may be arranged between two neighboring decoding units or may be arranged between two neighboring row-layered decoding units. Herein, an $i^{th}$ row-layered decoding process is used as an example. The updated ΣCN and the updated second APP may also be obtained after $i^{th}$ row-layered decoding is performed. The old ΣCN may be a sum of all CN obtained through calculation by a row-layered decoding unit or a re-demapping unit that is prior to the $i^{th}$ row-layered decoding unit and connected to the $i^{th}$ row-layered decoding unit in series, or obtained after the $i^{th}$ row-layered decoding unit performs a summation operation on all CN output by a previous row-layered decoding unit or re-demapping unit. Similarly, the new ΣCN may also be output after the $i^{th}$ row-layered decoding unit performs a summation operation, or may be calculated by a following row-layered decoding unit or re-demapping unit when being input to the following row-layered decoding unit or re-demapping unit.

It should be noted that the second APP of the target bit may be obtained by performing step 101 to step 104. If the second APP is a last APP value output in the decoding process, whether a value of the target bit is 0 or 1 may be determined based on a magnitude relationship between the APP value and 0. For example, if the APP value is greater than or equal to 0, the target bit corresponding to the APP value is 0; if the APP value is less than 0, the target bit corresponding to the APP value is 1. Because each symbol corresponds to a plurality of bits, determining results of all bits corresponding to one symbol can be obtained by repeating step 101 to step 104, so that a decoding result of the symbol is obtained. Similarly, if a plurality of symbols are available, decoding results of the plurality of symbols can be obtained in the foregoing manner.

According to the convolutional LDPC decoding method provided in this embodiment of the present invention, the LLR and the first APP are determined based on all the received check node information that is corresponding to the target bit and output by the previous-level decoding unit and the symbol value that is corresponding to the target bit and read from the symbol caching unit, and then all the check node information that is corresponding to the target bit and output by the previous-level decoding unit and the first APP are sent to the next-level decoding unit, so that the next-level decoding unit obtains the second APP and the second check node information. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. However, in a convolutional LDPC decoding process in the present invention, the LLR may be adjusted based on all the check node information that is corresponding to the target bit and output by the previous-level decoding unit and the symbol value corresponding to the target bit. In other words, on the basis of adjusting the first check node information, the LLR is adjusted to further improve accuracy of the convolutional LDPC decoding process. In this way, accuracy of a decoding process implemented in a coherent optical transmission system can be improved. To be specific, a receiver may perform decoding based on a symbol value received from a transmitter, and obtain an accurate decoding result, thereby improving transmission performance of the coherent optical transmission system.

Figure 7:
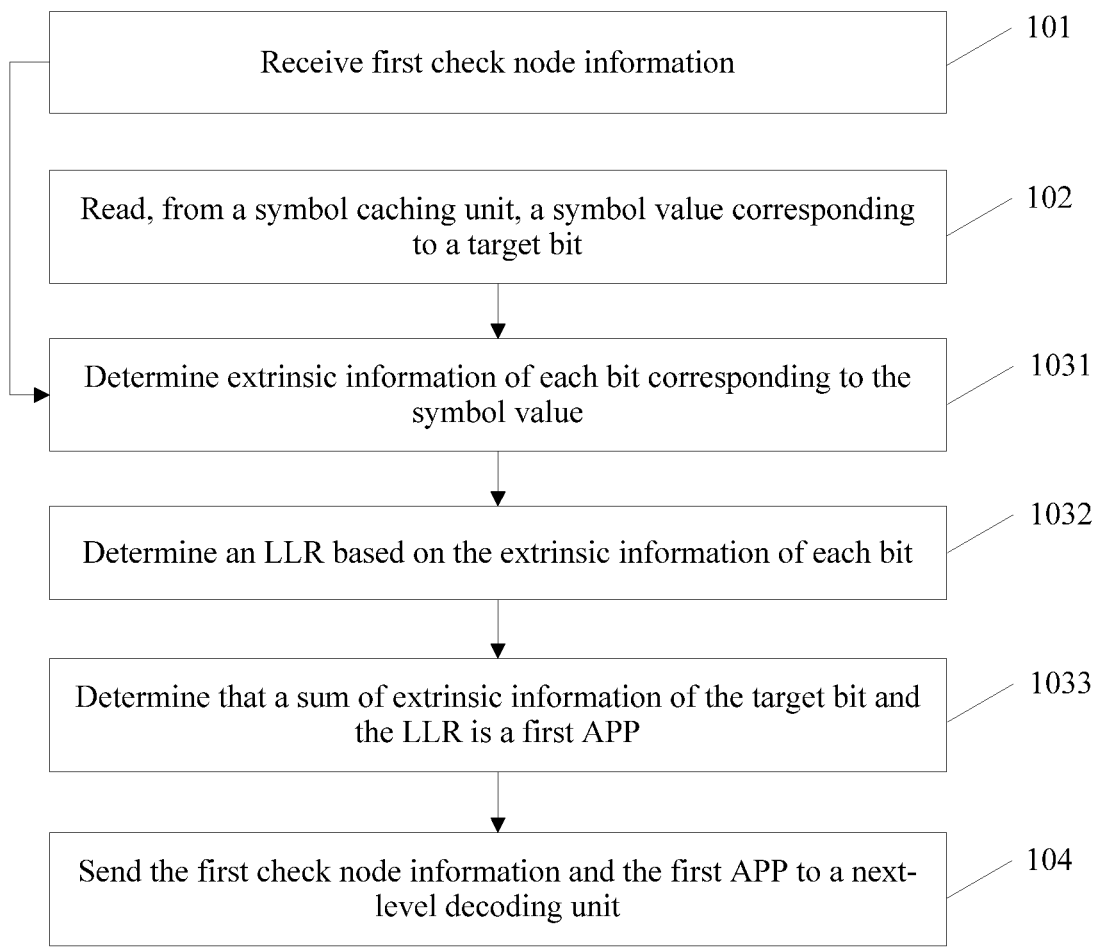
FIG. 7 is a flowchart of another convolutional LDPC decoding method according to an embodiment of the present invention.

In an implementation of this embodiment of the present invention, a method specifically used for determining the LLR and the first APP is provided. Therefore, on the basis of the implementation shown in FIG. 4, the implementation shown in FIG. 7 may be further implemented. Step 103 of determining an LLR and a first APP based on the first check node information and the symbol value may be specifically implemented as step 1031 to step 1033.

1031. Determine extrinsic information of each bit corresponding to the symbol value.

The symbol value corresponds to at least two bits and the extrinsic information is a sum of all check node information output by the previous-level decoding unit.

Because each symbol value can correspond to a plurality of points in an IQ coordinate system, each symbol value can correspond to a plurality of bits. For example, one symbol may correspond to eight values, and the eight values indicate eight different points in the IQ coordinate system. Because $8=2^3$, the symbol value corresponds to 3 bits, and extrinsic information of the 3 bits needs to be separately determined in step 1031.

1032. Determine the LLR based on the extrinsic information of each bit.

1033. Determine that a sum of extrinsic information of the target bit and the LLR is the first APP.

According to the convolutional LDPC decoding method provided in this embodiment of the present invention, the LLR may be determined by determining the extrinsic information of each bit corresponding to the obtained symbol value, and the sum of the extrinsic information of the target bit and the LLR is determined as the first APP. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. In the present invention, on the basis of adjusting the first check node information, the LLR is adjusted to further improve accuracy of the convolutional LDPC decoding process. In this way, accuracy of a decoding process implemented in a coherent optical transmission system can be improved. To be specific, a receiver may perform decoding based on a symbol value received from a transmitter, and obtain an accurate decoding result, thereby improving transmission performance of the coherent optical transmission system. In addition, in the process of determining the LLR, the extrinsic information of each bit corresponding to the symbol value may be first determined. To be specific, extrinsic information of an individual bit is determined by performing summation on all check node information of the individual bit. Then, the LLR is determined based on the obtained extrinsic information of each bit. This ensures that the determined LLR can achieve a convergence effect, so that the accuracy of the decoding process is further improved. In other words, the transmission performance of the coherent optical transmission system is further improved.

Figure 8:
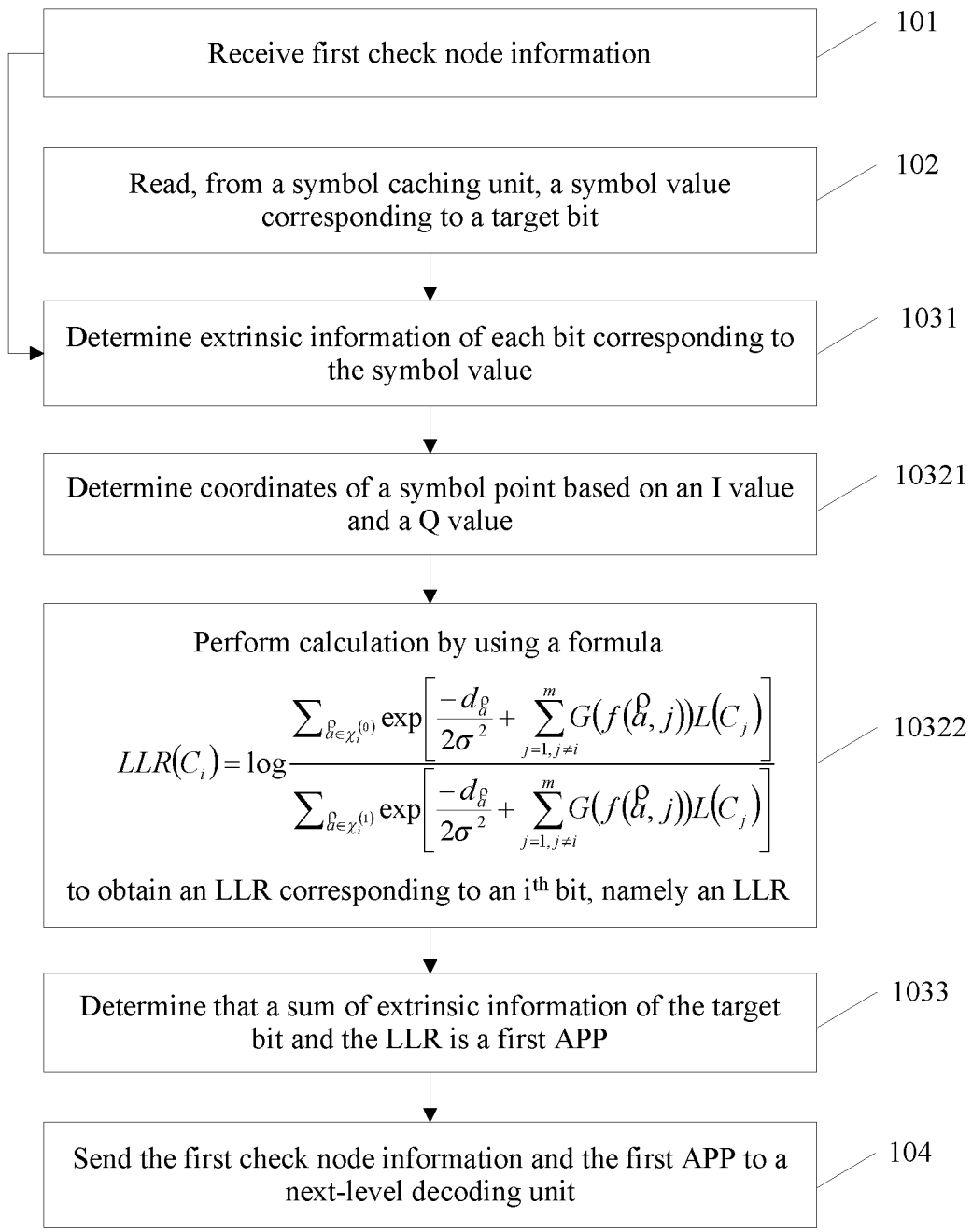
FIG. 8 is a flowchart of another convolutional LDPC decoding method according to an embodiment of the present invention.

To accurately determine the LLR, in an implementation of this embodiment of the present invention, the symbol value includes an I value and a Q value, the symbol value is used to indicate a symbol point, and the required LLR may be obtained by performing calculation by using the formula in step 10322 with reference to the extrinsic information of all bits of a same symbol. Therefore, on the basis of the implementation shown in FIG. 5, the implementation shown in FIG. 8 may be further implemented. Step 1032 of determining the LLR based on the extrinsic information of each bit may be specifically implemented as step 10321 and step 10322:

10321. Determine coordinates of a symbol point based on an I value and a Q value.

10322. Perform calculation by using a formula $$LLR(C_i) = \log \frac{\sum_{\overset{p}{a} \in \chi_i^{(0)}} \exp\left[\frac{-d_{\overset{p}{a}}}{2\sigma^2} + \sum_{j=1, j \neq i}^{m} G(f(\overset{p}{a}, j))L(C_j)\right]}{\sum_{\overset{p}{a} \in \chi_i^{(1)}} \exp\left[\frac{-d_{\overset{p}{a}}}{2\sigma^2} + \sum_{j=1, j \neq i}^{m} G(f(\overset{p}{a}, j))L(C_j)\right]}$$

to obtain an LLR corresponding to an $i^{th}$ bit, namely the LLR.

$a$ indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_a^p$ indicates a Euclidean distance from the symbol point to the target constellation point, $f(\overset{p}{a}, j)$ indicates a value of a $j^{th}$ bit in the target constellation point, $G(x)$ indicates a function of x, $$G(x) = \begin{cases} 1 & \text{if } (x == 0) \\ 0 & \text{if } (x == 1) \end{cases},$$

$L(C_j)$ indicates extrinsic information of the $j^{th}$ bit, $\sigma$ indicates a standard deviation, m is a positive integer greater than 1, and i and j are positive integers greater than or equal to 1.

For example, when the symbol value corresponds to 3 bits, in other words, when the symbol value corresponds to eight values, if step 10322 is performed to determine an LLR of the first bit, i is 1, and j may be 2 or 3. The first bit may be 1 or 0. For the eight values, the first bit is 0 in four points, and the four points constitute a set $\chi_i^{(0)}$, and the first bit is 1 also in four points, and the four points constitute a set $\chi_i^{(1)}$. It should be noted that, compared with offline experiment results in back-to-back (BTB), multi-wavelength hybrid transmission, and 12-span 6652 fiber transmission in a serial demodulation decoding solution in the prior art, when the technical solutions proposed in this embodiment of the present disclosure are used, performance of an Optical Signal-to-Noise Ratio (OSNR) is improved in all the three scenarios.

According to the convolutional LDPC decoding method provided in this embodiment of the present invention, the coordinates of the symbol point may be determined based on the I value and the Q value in the obtained symbol value, and then the LLR is obtained through calculation by using the formula. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. In the present invention, on the basis of adjusting the first check node information, the LLR is adjusted to further improve accuracy of the convolutional LDPC decoding process. In this way, accuracy of a decoding process implemented in a coherent optical transmission system can be improved. To be specific, a receiver may perform decoding based on a symbol value received from a transmitter, and obtain an accurate decoding result, thereby improving transmission performance of the coherent optical transmission system. In addition, in the process of determining the LLR, not only a position of the symbol point is considered, but also the extrinsic information of each bit corresponding to the symbol value is considered. In addition, calculation is performed with reference to the formula, so that a more applicable LLR is obtained. This means that the LLR and ΣCN are alternately adjusted to ensure the accuracy of the decoding process, and the transmission performance of the coherent optical transmission system is further improved.

Figure 9:
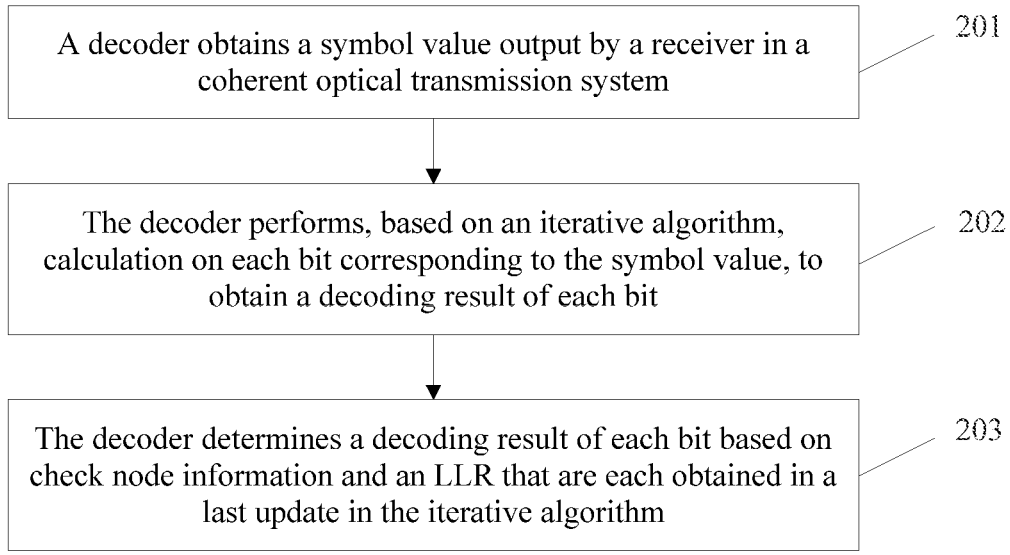
FIG. 9 is a flowchart of another convolutional LDPC decoding method according to an embodiment of the present invention.

An embodiment of the present disclosure provides a convolutional LDPC decoding method. The method is used in a coherent optical transmission system and the method may be executed by a decoder. As shown in FIG. 9, a procedure for the method includes:

201. The decoder obtains a symbol value output by a receiver in the coherent optical transmission system.

202. The decoder performs, based on an iterative algorithm, calculation on each bit corresponding to the symbol value, to obtain a decoding result of each bit.

The iterative algorithm includes at least one update of check node information and at least one update of an LLR.

203. The decoder determines a decoding result of each bit based on check node information and an LLR that are each obtained in a last update in the iterative algorithm.

It should be noted that for the process in which the decoder performs calculation on each bit based on the iterative algorithm, refer to the foregoing implementations, and details are not described herein.

According to the convolutional LDPC decoding method provided in this embodiment of the present invention, the decoder obtains the symbol value output by the receiver in the coherent optical transmission system; then performs, based on the iterative algorithm, calculation on each bit corresponding to the symbol value, to obtain the decoding result of each bit; and determines the decoding result of each bit based on the check node information and the LLR that are each obtained in the last update in the iterative algorithm. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. However, in a convolutional LDPC decoding process in the present invention, the LLR may be adjusted by performing, based on the iterative algorithm, an operation on each bit corresponding to the symbol value. In other words, on the basis of adjusting first check node information, the LLR is adjusted to further improve accuracy of the convolutional LDPC decoding process. In this way, accuracy of a decoding process implemented in the coherent optical transmission system can be improved. To be specific, a receiver may perform decoding based on a symbol value received from a transmitter, and obtain an accurate decoding result, thereby improving transmission performance of the coherent optical transmission system.

Figure 10:
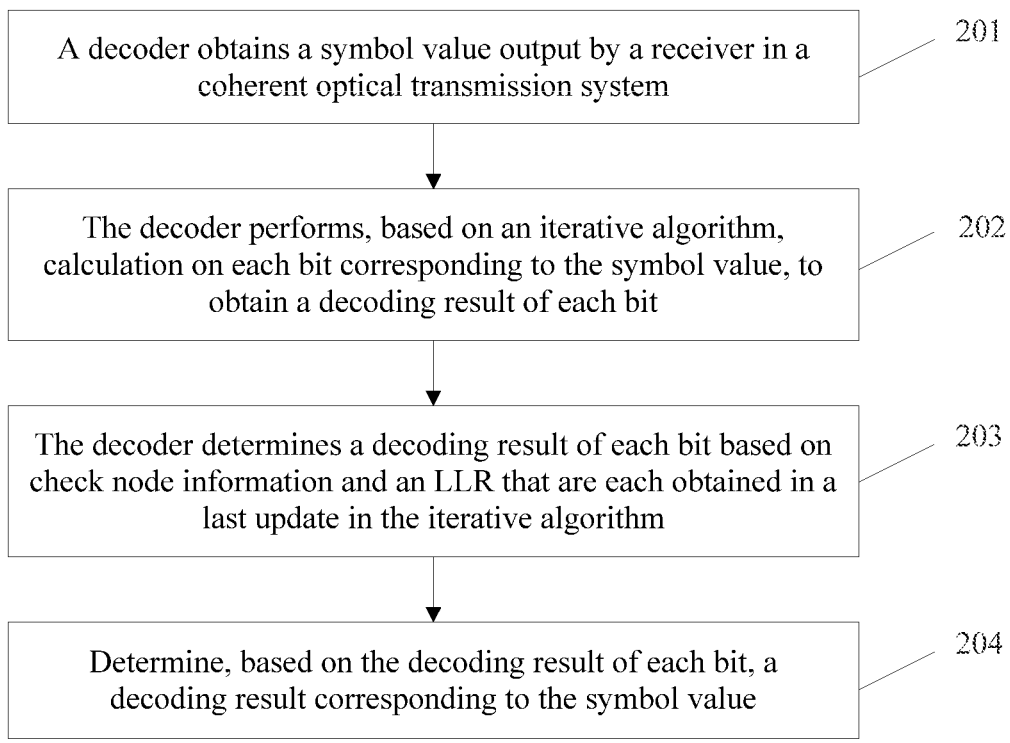
FIG. 10 is a flowchart of another convolutional LDPC decoding method according to an embodiment of the present invention.

To obtain a decoding result of the whole symbol value, in an implementation of this embodiment of the present invention, the decoding result of each bit corresponding to the symbol value needs to be determined before the decoding result corresponding to the symbol value is determined. Therefore, on the basis of the implementation shown in FIG. 9, the implementation shown in FIG. 10 may be further implemented. After step 203 in which the decoder determines a decoding result of each bit based on check node information and an LLR that are each obtained in a last update in the iterative algorithm is performed, step 204 may be further performed:

204. The decoder determines, based on the decoding result of each bit, a decoding result corresponding to the symbol value.

Because the decoder can obtain a decoding result of each bit, the decoder can obtain the decoding result of each of the bits corresponding to the symbol value. In consideration of that the bits corresponding to the symbol value are a sequential binary bit stream, a position in which the decoding result of each bit is located in the binary bit stream may be determined based on the decoding result obtained herein and a correspondence between each bit and the decoding result of each bit. In other words, decoding results of the bits are sorted in order, so that an ordered binary bit stream, that is, the decoding result corresponding to the symbol value, can be obtained.

According to the convolutional LDPC decoding method provided in this embodiment of the present invention, in the process of determining the decoding result, the decoding result of each bit corresponding to the symbol value needs to be determined before the decoding result corresponding to the symbol value is determined. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. In the present invention, when the accuracy of the decoding process implemented in the coherent optical transmission system is improved, in the decoding process, each bit corresponding to the symbol value is decoded first to obtain the decoding result corresponding to each bit, and then the decoding results are integrated to obtain the decoding result corresponding to the whole symbol value. In this way, not only the accuracy of the decoding process can be further improved, but also an error rate of the decoding process can be reduced to some extent, because data is decoded in unit of bit.

Figure 11:
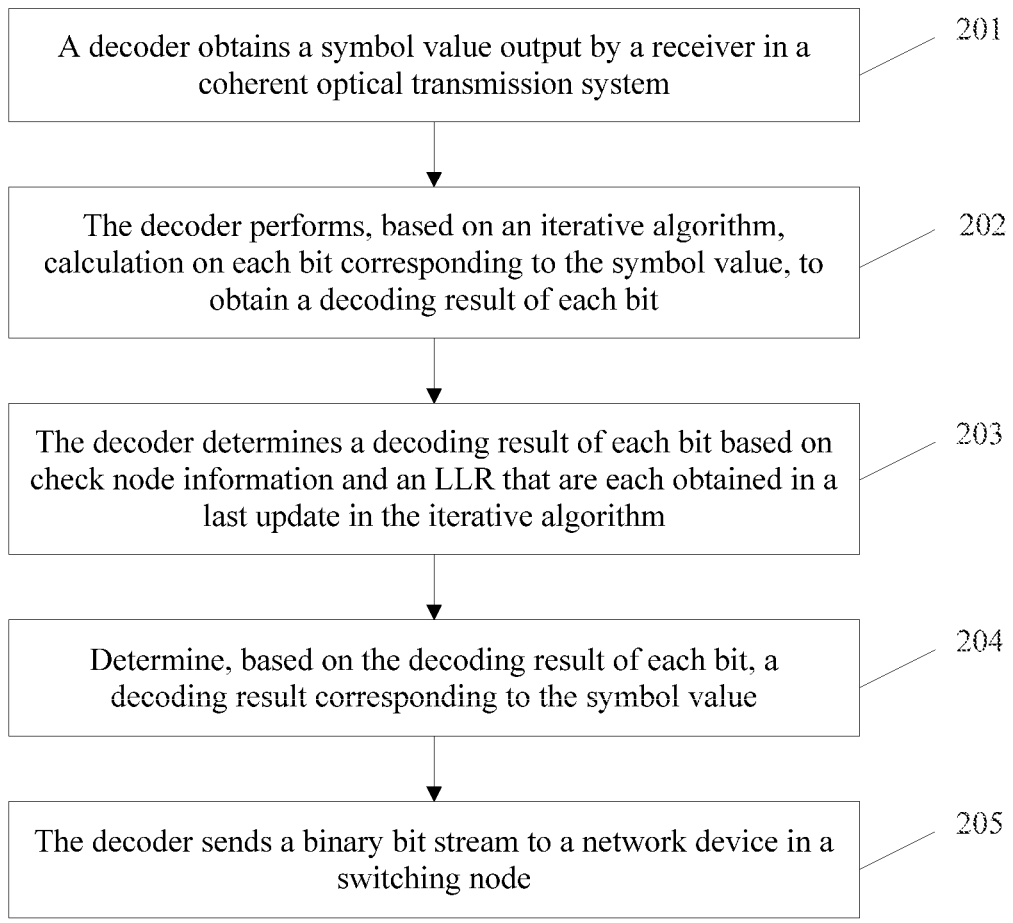
FIG. 11 is a flowchart of another convolutional LDPC decoding method according to an embodiment of the present invention.

In an implementation of this embodiment of the present invention, the decoding result corresponding to the symbol value may be a binary bit stream. This means that the decoder may directly transmit the decoding result as communication data to a network device in a switching node, and the network device sends the communication data to a target device that needs the communication data, to complete a communication data forwarding process. Therefore, on the basis of the implementation shown in FIG. 10, the implementation shown in FIG. 11 may be further implemented. After step 204 in which the decoder determines, based on the decoding result of each bit, a decoding result corresponding to the symbol value is performed, step 205 may be further performed:

205. The decoder sends a binary bit stream to a network device in a switching node.

In this embodiment of the present invention, the binary bit stream may be directly transmitted as communication data. Therefore, the decoder may directly send, to a network device in a switching node, the obtained decoding result corresponding to the symbol value, and then the network device may forward the decoding result to a target device, to complete a communication data transmission process. For example, when the binary bit stream is used to indicate an audio signal, the decoder may directly send the audio signal to a target device, that is, a corresponding terminal that needs to receive the audio signal; alternatively, a network device forwards the audio signal to a target device, that is, a router device with a forwarding function forwards the audio signal to a terminal that needs to receive the audio signal.

It should be noted that, in this embodiment of the present invention, no specific limitation is imposed on a type of data indicated by the binary bit stream, and the data type may be determined based on different communication data transmission scenarios. In addition, for different types of communication data, the target device may be a variety of devices that have a receiving function and correspond to the communication data. Herein, no specific limitation is imposed on a type of the target device.

According to the convolutional LDPC decoding method provided in this embodiment of the present invention, after the decoding process is completed, the obtained binary bit stream may be used as communication data and sent to the network device, so that the network device can send the communication data to the target device. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. In the present invention, when the accuracy of the decoding process implemented in the coherent optical transmission system is improved, the decoding result can be sent to the network device, and then sent to the target device by the network device, to complete the communication data forwarding process.

Figure 12:
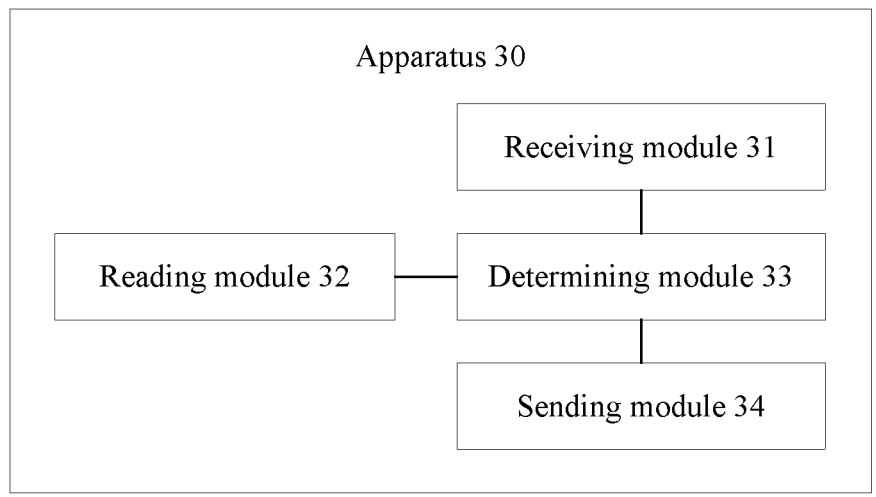
FIG. 12 is a schematic structural diagram of a convolutional LDPC decoding apparatus according to an embodiment of the present invention.

An embodiment of the present disclosure provides a convolutional LDPC decoding apparatus 30. The apparatus 30 is used in a coherent optical transmission system. The apparatus 30 may be configured to execute the method procedure shown in FIG. 4, FIG. 7, or FIG. 8. As shown in FIG. 12, the apparatus 30 includes:

a receiving module 31, configured to receive first check node information including all check node information that is corresponding to a target bit and output by a previous-level decoding unit;

a reading module 32, configured to read, from a symbol caching unit, a symbol value corresponding to the target bit;

a determining module 33, configured to determine a log-likelihood ratio (LLR) and a first a priori probability (APP) based on the first check node information received by the receiving module 31 and the symbol value read by the reading module 32, where the first APP is used to indicate a decoding result of the target bit at a first moment; and a sending module 34, configured to send the first check node information and the first APP determined by the determining module 33 to a next-level decoding unit, so that the next-level decoding unit obtains a second APP and second check node information based on the first check node information and the first APP, where the second APP is used to indicate a decoding result of the target bit at a second moment, and the second check node information includes all check node information that is corresponding to the target bit and output by the next-level decoding unit.

In an implementation of this embodiment of the present invention, the determining module 33 is specifically configured to: determine extrinsic information of each bit corresponding to the symbol value, where the symbol value corresponds to at least two bits and the extrinsic information is a sum of all check node information output by the previous-level decoding unit;

determine the LLR based on the extrinsic information of each bit; and determine that a sum of extrinsic information of the target bit and the LLR is the first APP.

In an implementation of this embodiment of the present invention, the symbol value includes an I value and a Q value, the symbol value is used to indicate a symbol point, and the determining module 33 is specifically configured to determine coordinates of the symbol point based on the I value and the Q value; and perform calculation by using a formula $$LLR(C_i) = \log \frac{\sum_{a \in \chi_i^{(0)}} \exp\left[\frac{-d_a^\rho}{2\sigma^2} + \sum_{j=1, j \neq i}^{m} G(f(\overset{\rho}{a}, j))L(C_j)\right]}{\sum_{a \in \chi_i^{(1)}} \exp\left[\frac{-d_a^\rho}{2\sigma^2} + \sum_{j=1, j \neq i}^{m} G(f(\overset{\rho}{a}, j))L(C_j)\right]}$$

to obtain an LLR corresponding to an $i^{th}$ bit, namely the LLR, where a indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_a^\rho$ indicates a Euclidean distance from the symbol point to the target constellation point, $f(\overset{k}{a}, j)$ indicates a value of a $j^{th}$ bit in the target constellation point, $G(x)$ indicates a function of x, $$G(x) = \begin{cases} 1 & \text{if } (x == 0) \\ 0 & \text{if } (x == 1) \end{cases}, L(C_j)$$

indicates extrinsic information of the $j^{th}$ bit, σ indicates a standard deviation, m is a positive integer greater than 1, and i and j are positive integers greater than or equal to 1.

According to the convolutional LDPC decoding apparatus provided in this embodiment of the present invention, the LLR and the first APP are determined based on all the check node information that is corresponding to the target bit and output by the previous-level decoding unit and the symbol value that is corresponding to the target bit and read from the symbol caching unit, and then all the check node information that is corresponding to the target bit and output by the previous-level decoding unit and the first APP are sent to the next-level decoding unit, so that the next-level decoding unit obtains the second APP and the second check node information. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. However, in a convolutional LDPC decoding process in the present invention, the LLR may be adjusted based on all the check node information that is corresponding to the target bit and output by the previous-level decoding unit and the symbol value corresponding to the target bit. In other words, on the basis of adjusting the first check node information, the LLR is adjusted to further improve accuracy of the convolutional LDPC decoding process. In this way, accuracy of a decoding process implemented in the coherent optical transmission system can be improved. To be specific, a receiver may perform decoding based on a symbol value received from a transmitter, and obtain an accurate decoding result, thereby improving transmission performance of the coherent optical transmission system.

Figure 13:
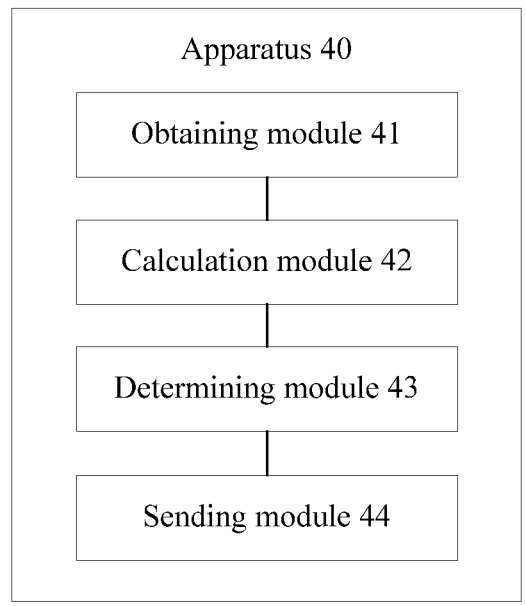
FIG. 13 is a schematic structural diagram of another convolutional LDPC decoding apparatus according to an embodiment of the present invention.

An embodiment of the present disclosure provides a convolutional LDPC decoding apparatus 40. The apparatus 40 is used in a coherent optical transmission system. The apparatus 40 may be configured to execute any one of the method procedures shown in FIG. 9 to FIG. 11. As shown in FIG. 13, the apparatus 40 includes:

an obtaining module 41, configured to obtain a symbol value output by a receiver in the coherent optical transmission system;

a calculation module 42, configured to perform, based on an iterative algorithm, calculation on each bit corresponding to the symbol value obtained by the obtaining module 41, to obtain a decoding result of each bit, where the iterative algorithm includes at least one update of check node information and at least one update of a log-likelihood ratio (LLR); and a determining module 43, configured to determine a decoding result of each bit based on check node information and an LLR that are each obtained in a last update in the iterative algorithm executed by the calculation module 42.

In an implementation of this embodiment of the present invention, the determining module 43 is further configured to determine, based on the decoding result of each bit, a decoding result corresponding to the symbol value.

In an implementation of this embodiment of the present invention, the decoding result corresponding to the symbol value is a binary bit stream, and the apparatus 40 further includes:

a sending module 44, configured to send the binary bit stream to a network device in a switching node, so that the network device sends the binary bit stream to a target device, to complete a communication data transmission process.

According to the convolutional LDPC decoding apparatus provided in this embodiment of the present invention, the decoder obtains the symbol value output by the receiver in the coherent optical transmission system; then performs, based on the iterative algorithm, calculation on each bit corresponding to the symbol value, to obtain the decoding result of each bit; and determines the decoding result of each bit based on the check node information and the LLR that are each obtained in the last update in the iterative algorithm. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. However, in a convolutional LDPC decoding process in the present invention, the LLR may be adjusted by performing, based on the iterative algorithm, an operation on each bit corresponding to the symbol value. In other words, on the basis of adjusting first check node information, the LLR is adjusted to further improve accuracy of the convolutional LDPC decoding process. In this way, accuracy of a decoding process implemented in the coherent optical transmission system can be improved. To be specific, a receiver may perform decoding based on a symbol value received from a transmitter, and obtain an accurate decoding result, thereby improving transmission performance of the coherent optical transmission system.

Figure 14:
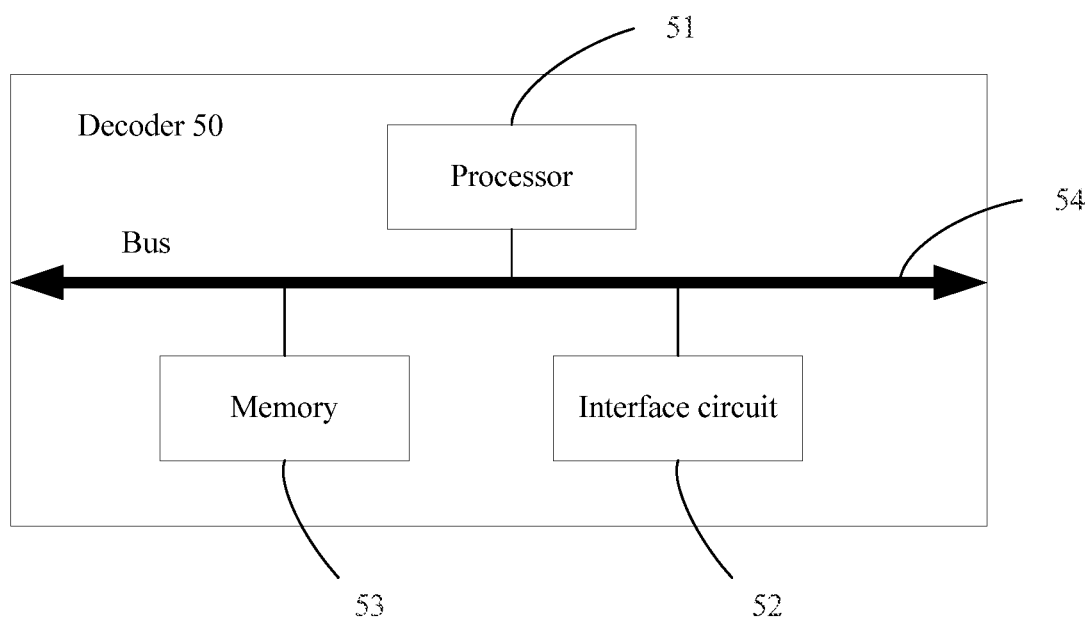
FIG. 14 is a schematic structural diagram of a decoder according to an embodiment of the present invention.
Figure 8:
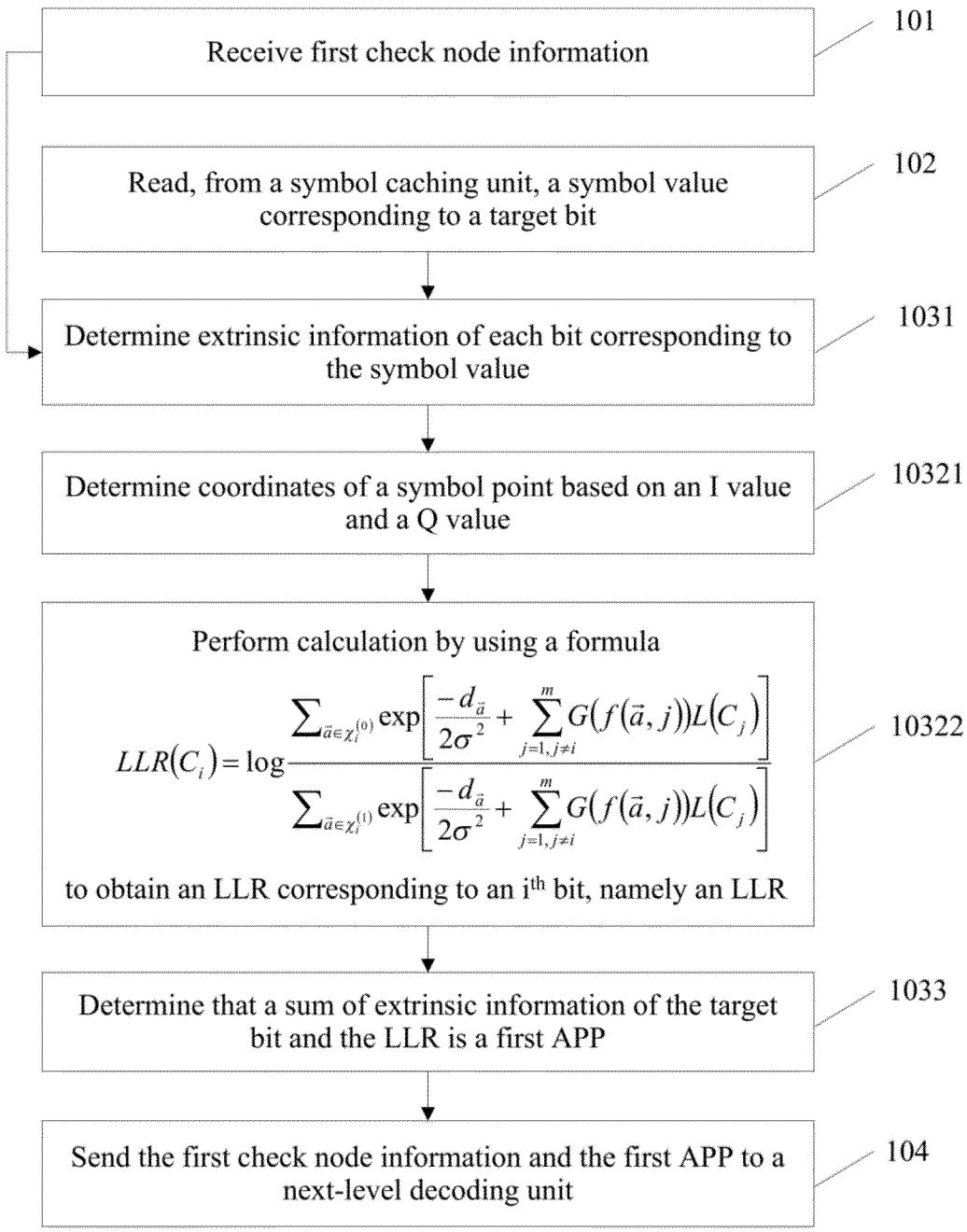

An embodiment of the present disclosure provides a decoder 50. The decoder 50 is used in a coherent optical transmission system. The decoder 50 may be configured to execute the method procedure shown in FIG. 4, FIG. 7, or FIG. 8. As shown in FIG. 14, the decoder 50 includes a processor 51 and an interface circuit 52. A memory 53 and a bus 54 are also shown in the figure. The processor 51, the interface circuit 52, and the memory 53 are connected by using the bus 54 to complete mutual communication.

It should be noted that the processor 51 herein may be one processing element or may be a collective term of a plurality of processing elements. For example, the processing element may be a central processing unit (CPU), or an application specific integrated circuit (ASIC), or may be configured as one or more integrated circuits implementing this embodiment of the present invention, for example, one or more microprocessors, one or more digital signal processors (DSPs) or one or more field programmable gate arrays (FPGAs).

The memory 53 may be one memory apparatus or may be a collective term of a plurality of memory elements, and is configured to store executable program code or a parameter, data, and the like that are required for operating of an access network management device. In addition, the memory 53 may include a random access memory (RAM), and may further include a non-volatile memory, for example, a disk memory and a flash memory.

The bus 54 may be an Industry Standard Architecture (ISA) bus, a Peripheral Component Interconnect (PCI) bus, or an Extended Industry Standard Architecture (EISA) bus, or the like. The bus 54 may be classified into an address bus, a data bus, a control bus, and the like. For ease of representation, in FIG. 14, the bus 54 is represented by only one bold line, but this does not mean that only one bus or one type of bus is available.

The decoder 50 may further include an input and output apparatus that is connected to the bus 54, so that the input and output apparatus connects to another part such as the processor 51 by using the bus 54.

The processor 51 invokes program code in the memory 53 and is configured to perform the operations performed by the decoder 50 in the foregoing method embodiment. For example, the operations include:

obtaining, by using the interface circuit 52, a symbol value output by a receiver in the coherent optical transmission system;

performing, by using the processor 51 based on an iterative algorithm, calculation on each bit corresponding to the symbol value, to obtain a decoding result of each bit, where the iterative algorithm includes at least one update of check node information and at least one update of a log-likelihood ratio (LLR); and determining, by using the processor 51, a decoding result of each bit based on check node information and an LLR that are each obtained in a last update in the iterative algorithm.

In an implementation of this embodiment of the present invention, after the decoding result of each bit is determined, a decoding result corresponding to the symbol value is determined by using the processor 51 based on the decoding result of each bit, and then is sent.

According to the decoder provided in this embodiment of the present invention, the decoder obtains the symbol value output by the receiver in the coherent optical transmission system; then performs, based on the iterative algorithm, calculation on each bit corresponding to the symbol value, to obtain the decoding result of each bit; and determines the decoding result of each bit based on the check node information and the LLR that are each obtained in the last update in the iterative algorithm. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. However, in a convolutional LDPC decoding process in the present invention, the LLR may be adjusted by performing, based on the iterative algorithm, an operation on each bit corresponding to the symbol value. In other words, on the basis of adjusting first check node information, the LLR is adjusted to further improve accuracy of the convolutional LDPC decoding process. In this way, accuracy of a decoding process implemented in the coherent optical transmission system can be improved. To be specific, a receiver may perform decoding based on a symbol value received from a transmitter, and obtain an accurate decoding result, thereby improving transmission performance of the coherent optical transmission system.

An embodiment of the present disclosure provides a coherent optical transmission system including a transmitter, a receiver, and a decoder, and the decoder is the decoder 50 shown in FIG. 14.

According to the coherent optical transmission system provided in this embodiment of the present invention, the decoder obtains a symbol value output by the receiver in the coherent optical transmission system; then performs, based on an iterative algorithm, calculation on each bit corresponding to the symbol value, to obtain a decoding result of each bit; and determines a decoding result of each bit based on check node information and an LLR that are each obtained in a last update in the iterative algorithm. By contrast, in the prior art, after being processed by a demapping unit, a symbol successively passes through decoding units 1 to n, and finally passes through a determining output unit to obtain a decoding result. This means that, in a convolutional LDPC decoding process in the prior art, decoding accuracy is improved simply by adjusting check node information. However, in a convolutional LDPC decoding process in the present invention, the LLR may be adjusted by performing, based on the iterative algorithm, an operation on each bit corresponding to the symbol value. In other words, on the basis of adjusting first check node information, the LLR is adjusted to further improve accuracy of the convolutional LDPC decoding process. In this way, accuracy of a decoding process implemented in the coherent optical transmission system can be improved. To be specific, a receiver may perform decoding based on a symbol value received from a transmitter, and obtain an accurate decoding result, thereby improving transmission performance of the coherent optical transmission system.

The embodiments in this specification are all described in a progressive manner, for same or similar parts in the embodiments, reference may be made to these embodiments, and each embodiment focuses on a difference from other embodiments. Especially, a device embodiment is basically similar to a method embodiment, and therefore is described briefly; for related parts, reference may be made to partial descriptions in the method embodiment.

A person of ordinary skill in the art may understand that all or a part of the processes of the methods in the embodiments may be implemented by a computer program instructing relevant hardware. The program may be stored in a computer readable storage medium. When the program runs, the processes of the methods in the embodiments are performed. The foregoing storage medium may include: a magnetic disk, an optical disc, a read-only memory (ROM), or a random access memory (RAM).

The foregoing descriptions are merely specific implementations of the present invention, but are not intended to limit the protection scope of the present invention. Any variation or replacement readily figured out by a person skilled in the art within the technical scope disclosed in the present disclosure shall fall within the protection scope of the present invention. Therefore, the protection scope of the present disclosure shall be subject to the protection scope of the claims.

What is claimed is:

1. A convolutional low-density parity-check (LDPC) decoding method, the method comprising:

receiving first check node information comprising all check node information that corresponds to a target bit and output by a previous-level decoding unit;

reading, from a symbol caching unit, a symbol value corresponding to the target bit;

determining a log-likelihood ratio (LLR) and a first a priori probability (APP) based on the first check node information and the symbol value, wherein the first APP is indicative of a decoding result of the target bit at a first moment, wherein the determining the LLR and the first APP based on the first check node information and the symbol value comprises: determining extrinsic information of each bit corresponding to the symbol value, wherein the symbol value corresponds to at least two bits and the extrinsic information is a sum of all check node information output by the previous-level decoding unit; determining the LLR based on the extrinsic information of each bit; and determining that a sum of extrinsic information of the target bit and the LLR is the first APP; and sending the first check node information and the first APP to a next-level decoding unit, so that the next-level decoding unit obtains a second APP and second check node information based on the first check node information and the first APP, wherein the second APP is indicative of a decoding result of the target bit at a second moment, and the second check node information comprises all check node information that corresponds to the target bit and output by the next-level decoding unit.

2. The method according to claim 1, wherein the symbol value comprises an in-phase (I) value and a quadrature (Q) value, the symbol value is indicative of a symbol point, and the determining the LLR based on the extrinsic information of each bit comprises:

determining coordinates of the symbol point based on the I value and the Q value; and performing calculation by using a formula $$LLR(C_i) = \log \frac{\sum_{\hat{a} \in \chi_i^{(0)}} \exp\left[\frac{-d_{\hat{a}}^p}{2\sigma^2} + \sum_{j=1, j \neq i}^{m} G(f(\hat{a}, j))L(C_j)\right]}{\sum_{\hat{a} \in \chi_i^{(1)}} \exp\left[\frac{-d_{\hat{a}}^p}{2\sigma^2} + \sum_{j=1, j \neq i}^{m} G(f(\hat{a}, j))L(C_j)\right]}$$

to obtain an LLR corresponding to an $i^{th}$ bit, namely the LLR, wherein a indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_{\hat{a}}^p$ indicates a Euclidean distance from the symbol point to the target constellation point, $f(\hat{a}, j)$ indicates a value of a $j^{th}$ bit in the target constellation point, G(x) indicates a function of x, $$G(x) = \begin{cases} 1 & \text{if } (x == 0) \\ 0 & \text{if } (x == 1) \end{cases},$$

$L(C_j)$ indicates extrinsic information of the $j^{th}$ bit, σ indicates a standard deviation, m is a positive integer greater than 1, and i and j are positive integers greater than or equal to 1.

3. A convolutional low-density parity-check (LDPC) decoding method, used in a coherent optical transmission system, the method comprising:

obtaining, by a decoder, a symbol value output by a receiver in the coherent optical transmission system;

performing, by the decoder based on an iterative algorithm, calculation on each bit corresponding to the symbol value, to obtain a decoding result of each bit, wherein the iterative algorithm comprises at least one update of check node information and at least one update of a log-likelihood ratio (LLR), wherein the LLR is determined based on extrinsic information of each bit, the extrinsic information being a sum of all check node information output by a previous-level decoding unit; and determining, by the decoder, a decoding result of each bit based on check node information and an LLR that are each obtained in a last update in the iterative algorithm, wherein the symbol value comprises an in-phase (I) value and a quadrature (Q) value, the symbol value is indicative of a symbol point, and the determining the LLR based on the extrinsic information of each bit comprises:

determining coordinates of the symbol point based on the I value and the Q value; and Performing calculation by using a formula $$LLR(C_i) = \log \frac{\sum_{\hat{a} \in \chi_i^{(0)}} \exp\left[\frac{-d_{\hat{a}}^p}{2\sigma^2} + \sum_{j=1, j \neq i}^{m} G(f(\hat{a}, j))L(C_j)\right]}{\sum_{\hat{a} \in \chi_i^{(1)}} \exp\left[\frac{-d_{\hat{a}}^p}{2\sigma^2} + \sum_{j=1, j \neq i}^{m} G(f(\hat{a}, j))L(C_j)\right]}$$

to obtain an LLR corresponding to an $i^{th}$ bit, namely the LLR, wherein a indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_{\hat{a}}^p$ indicates a Euclidean distance from the symbol point to the target constellation point, $f(\hat{a}, j)$ indicates a value of a $j^{th}$ bit in the target constellation point, G(x) indicates a function of x, $$G(x) = \begin{cases} 1 & \text{if } (x == 0) \\ 0 & \text{if } (x == 1) \end{cases},$$

$L(C_j)$ indicates extrinsic information of the $j^{th}$ bit, σ indicates a standard deviation, m is a positive integer greater than 1, and i and j are positive integers greater than or equal to 1.

4. The method according to claim 3, wherein after the determining, by the decoder, a decoding result of each bit, the method comprises:

determining, by the decoder based on the decoding result of each bit, a decoding result corresponding to the symbol value.

5. The method according to claim 4, wherein the decoding result corresponding to the symbol value is a binary bit stream, and after the determining, by the decoder, a decoding result corresponding to the symbol value, the method comprises:

sending, by the decoder, the binary bit stream to a network device in a switching node, so that the network device sends the binary bit stream to a target device.

6. A convolutional low-density parity-check (LDPC) decoding apparatus, the apparatus comprising:

a receiver, configured to receive first check node information comprising all check node information that corresponds to a target bit and output by a previous-level decoding unit;

a processor, configured to read, from a symbol caching unit, a symbol value corresponding to the target bit;

the processor is further configured to determine a log-likelihood ratio (LLR) and a first a priori probability (APP) based on the first check node information and the symbol value, wherein the first APP is indicative of a decoding result of the target bit at a first moment, wherein the determining the LLR and the first APP based on the first check node information and the symbol value comprises: determining extrinsic information of each bit corresponding to the symbol value, wherein the symbol value corresponds to at least two bits and the extrinsic information is a sum of all check node information output by the previous-level decoding unit;

determining the LLR based on the extrinsic information of each bit; and determining that a sum of extrinsic information of the target bit and the LLR is the first APP; and a transmitter, configured to send the first check node information and the first APP to a next-level decoding unit, so that the next-level decoding unit obtains a second APP and second check node information based on the first check node information and the first APP, wherein the second APP is indicative of a decoding result of the target bit at a second moment, and the second check node information comprises all check node information that corresponds to the target bit and output by the next-level decoding unit.

7. The apparatus according to claim 6, wherein the symbol value comprises an in-phase (I) value and a quadrature (Q)

value, the symbol value is indicative of a symbol point, and the processor determining the LLR based on the extrinsic information of each bit comprises: determining coordinates of the symbol point based on the I value and the Q value; and performing calculation by using a formula $$LLR(C_i) = \log \frac{\sum_{a \in \chi_i^{(0)}} \exp\left[\frac{-d_a^\rho}{2\sigma^2} + \sum_{j=1, j \neq i}^{m} G(f(\overset{\rho}{a}, j))L(C_j)\right]}{\sum_{a \in \chi_i^{(1)}} \exp\left[\frac{-d_a^\rho}{2\sigma^2} + \sum_{j=1, j \neq i}^{m} G(f(\overset{\rho}{a}, j))L(C_j)\right]}$$

to obtain an LLR corresponding to an $i^{th}$ bit, namely the LLR, wherein a indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_a^\rho$ indicates a Euclidean distance from the symbol point to the target constellation point, $f(\overset{\rho}{a}, j)$ indicates a value of a $j^{th}$ bit in the target constellation point, $G(x)$ indicates a function of x, $$G(x) = \begin{cases} 1 & \text{if}(x == 0) \\ 0 & \text{if}(x == 1) \end{cases},$$

$L(C_j)$ indicates extrinsic information of the $j^{th}$ bit, $\sigma$ indicates a standard deviation, m is a positive integer greater than 1, and i and j are positive integers greater than or equal to 1.

8. A decoder used in a coherent optical transmission system, the decoder comprising:
an interface circuit, configured to obtain a symbol value output by a receiver in the coherent optical transmission system; and
a processor, configured to perform, based on an iterative algorithm, calculation on each bit corresponding to the symbol value, to obtain a decoding result of each bit, wherein the iterative algorithm comprises at least one update of check node information and at least one update of a log-likelihood ratio (LLR), wherein the LLR is determined based on extrinsic information of each bit, the extrinsic information being a sum of all check node information output by a previous-level decoding unit; wherein
the processor is further configured to determine a decoding result of each bit based on check node information and an LLR that are each obtained in a last update in the iterative algorithm, wherein the symbol value comprises an in-phase (I) value and a quadrature (Q) value, the symbol value is indicative of a symbol point, and the determining the LLR based on the extrinsic information of each bit comprises:
determining coordinates of the symbol point based on the I value and the Q value; and
Performing calculation by using a formula $$LLR(C_i) = \log \frac{\sum_{a \in \chi_i^{(0)}} \exp\left[\frac{-d_a^\rho}{2\sigma^2} + \sum_{j=1, j \neq i}^{m} G(f(\overset{\rho}{a}, j))L(C_j)\right]}{\sum_{a \in \chi_i^{(1)}} \exp\left[\frac{-d_a^\rho}{2\sigma^2} + \sum_{j=1, j \neq i}^{m} G(f(\overset{\rho}{a}, j))L(C_j)\right]}$$

to obtain an LLR corresponding to an $i^{th}$ bit, namely the LLR, wherein a indicates a target constellation point, $\chi_i^{(1)}$ indicates a set of constellation points obtained when the $i^{th}$ bit is 1, $\chi_i^{(0)}$ indicates a set of constellation points obtained when the $i^{th}$ bit is 0, $d_a^\rho$ indicates a Euclidean distance from the symbol point to the target constellation point, $f(\overset{\rho}{a}, j)$ indicates a value of a $j^{th}$ bit in the target constellation point, $G(x)$ indicates a function of x, $$G(x) = \begin{cases} 1 & \text{if}(x == 0) \\ 0 & \text{if}(x == 1) \end{cases},$$

$L(C_j)$ indicates extrinsic information of the $j^{th}$ bit, $\sigma$ indicates a standard deviation, m is a positive integer greater than 1, and i and j are positive integers greater than or equal to 1.

9. The decoder according to claim 8, wherein after determining the decoding result of each bit, the processor is further configured to: determine, based on the decoding result of each bit, a decoding result corresponding to the symbol value, and send the decoding result.

10. The decoder according to claim 8, wherein the decoding result corresponding to the symbol value is a binary bit stream, and the apparatus further comprises:
a transmitter, configured to send the binary bit stream to a network device in a switching node, so that the network device sends the binary bit stream to a target device.

* * * * *

UNITED STATES PATENT AND TRADEMARK OFFICE
CERTIFICATE OF CORRECTION

PATENT NO. : 10,903,855 B2
APPLICATION NO. : 16/191664
DATED : January 26, 2021
INVENTOR(S) : Li et al.

It is certified that error appears in the above-identified patent and that said Letters Patent is hereby corrected as shown below:

In the Drawings

Please delete Drawing Sheet 6 of 9 and substitute with the Drawing Sheet 6 of 9 as shown on the attached page.

In the Specification

At Column 3, Line 1-8, delete "$$LLR(C_i) = \log \frac{\sum_{\vec{a} \in \chi_i^{(0)}} \exp\left[\frac{-d_{\vec{a}}^{\rho}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}^{\rho}}{2\sigma^2} + \sum_{j=1, j \neq i}^{m} G(f(\vec{a}, j))L(C_j)\right]}$$" and insert --$$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j))L(C_j)\right]}$$--.

At Column 3, Line 13, delete "$d_a^\rho$" and insert --$d_{\vec{a}}$--.

At Column 3, Line 14, delete "$f(\vec{a}, j)$" and insert --$f(\vec{a}, j)$--.

At Column 5, Line 1-8, delete "$$LLR(C_i) = \log \frac{\sum_{\vec{a} \in \chi_i^{(0)}} \exp\left[\frac{-d_{\vec{a}}^{\rho}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}^{\rho}}{2\sigma^2} + \sum_{j=1, j \neq i}^{m} G(f(\vec{a}, j))L(C_j)\right]}$$" and insert Signed and Sealed this
Twenty-first Day of December, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,903,855 B2

$$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j)) L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j)) L(C_j)\right]}$$
--.

At Column 5, Line 13, delete "$d_a{}^p$" and insert -- $d_{\vec{a}}$ --.

At Column 5, Line 14, delete "$f(\vec{b}, j)$" and insert -- $f(\vec{a}, j)$ --.

At Column 12, Line 23-30, delete "
$$LLR(C_i) = \log \frac{\sum_{\vec{a} \in \chi_i^{(0)}} \exp\left[\frac{-d_{\vec{a}}^\rho}{2\sigma^2} + \sum_{j=1, j \neq i}^{m} G(f(\vec{a}^\rho, j)) L(C_j)\right]}{\sum_{\vec{a} \in \chi_i^{(1)}} \exp\left[\frac{-d_{\vec{a}}^\rho}{2\sigma^2} + \sum_{j=1, j \neq i}^{m} G(f(\vec{a}^\rho, j)) L(C_j)\right]}$$
" and insert $$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j)) L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j)) L(C_j)\right]}$$
--.

At Column 12, Line 36, delete "$d_a{}^p$" and insert -- $d_{\vec{a}}$ --.

At Column 12, Line 37, delete "$f(\vec{b}, j)$" and insert -- $f(\vec{a}, j)$ --.

At Column 16, Line 30-37, delete "
$$LLR(C_i) = \log \frac{\sum_{\vec{a} \in \chi_i^{(0)}} \exp\left[\frac{-d_{\vec{a}}^\rho}{2\sigma^2} + \sum_{j=1, j \neq i}^{m} G(f(\vec{a}^\rho, j)) L(C_j)\right]}{\sum_{\vec{a} \in \chi_i^{(1)}} \exp\left[\frac{-d_{\vec{a}}^\rho}{2\sigma^2} + \sum_{j=1, j \neq i}^{m} G(f(\vec{a}^\rho, j)) L(C_j)\right]}$$
" and insert $$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j)) L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j)) L(C_j)\right]}$$
--.

At Column 16, Line 42, delete "$d_a{}^p$" and insert -- $d_{\vec{a}}$ --.

At Column 16, Line 43, delete "$f(\vec{b}, j)$" and insert -- $f(\vec{a}, j)$ --.

CERTIFICATE OF CORRECTION (continued)
U.S. Pat. No. 10,903,855 B2

In the Claims

In Claim 2, Column 21, Line 4-12, delete "$$LLR(C_i) = \log \frac{\sum_{\vec{a} \in \chi_i^{(0)}} \exp\left[\frac{-d_{\vec{a}}^\rho}{2\sigma^2} + \sum_{j=1, j \neq i}^{m} G(f(\vec{a}^\rho, j))L(C_j)\right]}{\sum_{\vec{a} \in \chi_i^{(1)}} \exp\left[\frac{-d_{\vec{a}}^\rho}{2\sigma^2} + \sum_{j=1, j \neq i}^{m} G(f(\vec{a}^\rho, j))L(C_j)\right]}$$" and insert --$$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j))L(C_j)\right]}$$--.

In Claim 2, Column 21, Line 17, delete "$d_a^\rho$" and insert --$d_{\vec{a}}$--.

In Claim 2, Column 21, Line 18, delete "$f(\vec{a}, j)$" and insert --$f(\vec{a}, j)$--.

In Claim 3, Column 21, Line 57-65, delete "$$LLR(C_i) = \log \frac{\sum_{\vec{a} \in \chi_i^{(0)}} \exp\left[\frac{-d_{\vec{a}}^\rho}{2\sigma^2} + \sum_{j=1, j \neq i}^{m} G(f(\vec{a}^\rho, j))L(C_j)\right]}{\sum_{\vec{a} \in \chi_i^{(1)}} \exp\left[\frac{-d_{\vec{a}}^\rho}{2\sigma^2} + \sum_{j=1, j \neq i}^{m} G(f(\vec{a}^\rho, j))L(C_j)\right]}$$" and insert --$$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j))L(C_j)\right]}$$--.

In Claim 3, Column 22, Line 3, delete "$d_a^\rho$" and insert --$d_{\vec{a}}$--.

In Claim 3, Column 22, Line 4, delete "$f(\vec{a}, j)$" and insert --$f(\vec{a}, j)$--.

In Claim 7, Column 23, Line 6-15, delete "$$LLR(C_i) = \log \frac{\sum_{\vec{a} \in \chi_i^{(0)}} \exp\left[\frac{-d_{\vec{a}}^\rho}{2\sigma^2} + \sum_{j=1, j \neq i}^{m} G(f(\vec{a}^\rho, j))L(C_j)\right]}{\sum_{\vec{a} \in \chi_i^{(1)}} \exp\left[\frac{-d_{\vec{a}}^\rho}{2\sigma^2} + \sum_{j=1, j \neq i}^{m} G(f(\vec{a}^\rho, j))L(C_j)\right]}$$" and insert --$$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j))L(C_j)\right]}$$--.

CERTIFICATE OF CORRECTION (continued)
U.S. Pat. No. 10,903,855 B2

In Claim 7, Column 23, Line 20, delete "$d_a{}^p$" and insert --$d_{\vec{a}}$--.

In Claim 7, Column 23, Line 21, delete "$f(\vec{b}, j)$" and insert --$f(\vec{a}, j)$--.

In Claim 8, Column 24, Line 9-18, delete "
$$LLR(C_i) = \log \frac{\sum_{\vec{a} \in \chi_i^{(0)}} \exp\left[\frac{-d_{\vec{a}}^p}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}^p}{2\sigma^2} + \sum_{j=1, j \neq i}^{m} G(f(\vec{a}, j))L(C_j)\right]}$$
" and insert --
$$LLR(C_i) = \log \frac{\sum_{\vec{a} \in \chi_i^{(0)}} \exp\left[\frac{-d_{\vec{a}}}{2\sigma^2} + \sum_{j=1, j \neq i}^{m} G(f(\vec{a}, j))L(C_j)\right]}{\sum_{\vec{a} \in \chi_i^{(1)}} \exp\left[\frac{-d_{\vec{a}}}{2\sigma^2} + \sum_{j=1, j \neq i}^{m} G(f(\vec{a}, j))L(C_j)\right]}$$
--.

In Claim 8, Column 24, Line 24, delete "$d_a{}^p$" and insert --$d_{\vec{a}}$--.

In Claim 8, Column 24, Line 25, delete "$f(\vec{b}, j)$" and insert --$f(\vec{a}, j)$--.